(12) United States Patent
Afzalian

(10) Patent No.: US 11,018,226 B2
(45) Date of Patent: May 25, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Aryan Afzalian, Chastre (BE)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/397,005

(22) Filed: Apr. 29, 2019

(65) Prior Publication Data

US 2020/0058738 A1    Feb. 20, 2020

Related U.S. Application Data

(60) Provisional application No. 62/718,961, filed on Aug. 14, 2018.

(51) Int. Cl.
| | | |
|---|---|---|
| *H01L 29/10* | (2006.01) | |
| *H01L 29/08* | (2006.01) | |
| *H01L 29/66* | (2006.01) | |
| *H01L 29/78* | (2006.01) | |
| *H01L 29/423* | (2006.01) | |

(52) U.S. Cl.
CPC ...... *H01L 29/1045* (2013.01); *H01L 29/0847* (2013.01); *H01L 29/0895* (2013.01); *H01L 29/105* (2013.01); *H01L 29/1054* (2013.01); *H01L 29/42392* (2013.01); *H01L 29/66462* (2013.01); *H01L 29/66492* (2013.01); *H01L 29/66666* (2013.01); *H01L 29/7827* (2013.01); *H01L 29/7834* (2013.01); *H01L 29/7835* (2013.01)

(58) Field of Classification Search
CPC ............. H01L 29/1029; H01L 29/1033; H01L 29/1037; H01L 29/1041; H01L 29/105; H01L 29/1054
See application file for complete search history.

(56) References Cited

U.S. PATENT DOCUMENTS

| | | | |
|---|---|---|---|
| 6,630,385 B1 * | 10/2003 | Yu | .......... H01L 21/26506 438/289 |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |

(Continued)

OTHER PUBLICATIONS

Afzalian, et al.: "Scaling perspective for III-V broken gap nanowire TFETs: An atomistic study using a fast tight-binding mode-space NEGF model"; IEEE Xplore Digital Library; 2016; pp. 30.1.1-30.1.4.

(Continued)

*Primary Examiner* — Mark V Prenty
(74) *Attorney, Agent, or Firm* — McClure, Qualey & Rodack, LLP

(57) ABSTRACT

A semiconductor device includes a source region, a drain region, a core channel region, and a barrier layer. The core channel region is between the source region and the drain region. The barrier layer is between the core channel region and the drain region. The barrier layer is a graded doped barrier layer.

20 Claims, 31 Drawing Sheets

(56) References Cited

U.S. PATENT DOCUMENTS

| | | |
|---|---|---|
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2017/0186839 A1* | 6/2017 | Afzalian ............... H01L 29/205 |
| 2018/0068999 A1* | 3/2018 | Afzalian ............... H01L 29/205 |

OTHER PUBLICATIONS

Peng-Fei Wang: "Complementary Tunneling-FETs (CTFET) in CMOS Technology"; Technische Universität München Lehrstuhl für Technische Elektronik Fachgebiet Halbleiterproduktionstechnik; Oct. 11, 2003; pp. 1-184.

Dey, et al.: "Combining Axial and Radial Nanowire Heterostructures: Radial Esaki Diodes and Tunnel Field-Effect Transistors"; © 2013 American Chemical Society; pp. 5919-5924.

* cited by examiner

2400

US 11,018,226 B2

SEMICONDUCTOR DEVICE AND MANUFACTURING METHOD THEREOF

PRIORITY CLAIM AND CROSS-REFERENCE

This application claims priority to U.S. Provisional Application Ser. No. 62/718,961, filed Aug. 14, 2018, which is herein incorporated by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous challenges have risen. As features become closer, current leakage can become more noticeable, signals can crossover more easily, and power usage has become a significant concern. The semiconductor integrated circuit industry has produced numerous developments in effort to continue the process of scaling. One of the developments is the potential replacement or supplementation of the conventional MOS field-effect transistor by the tunneling field-effect transistor (TFET).

Tunneling FETs are promising devices that may enable further scaling of power supply voltage without substantially increasing off-state leakage currents due to its sub-60 mV/dec subthreshold swing. However, existing TFETs have not been satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
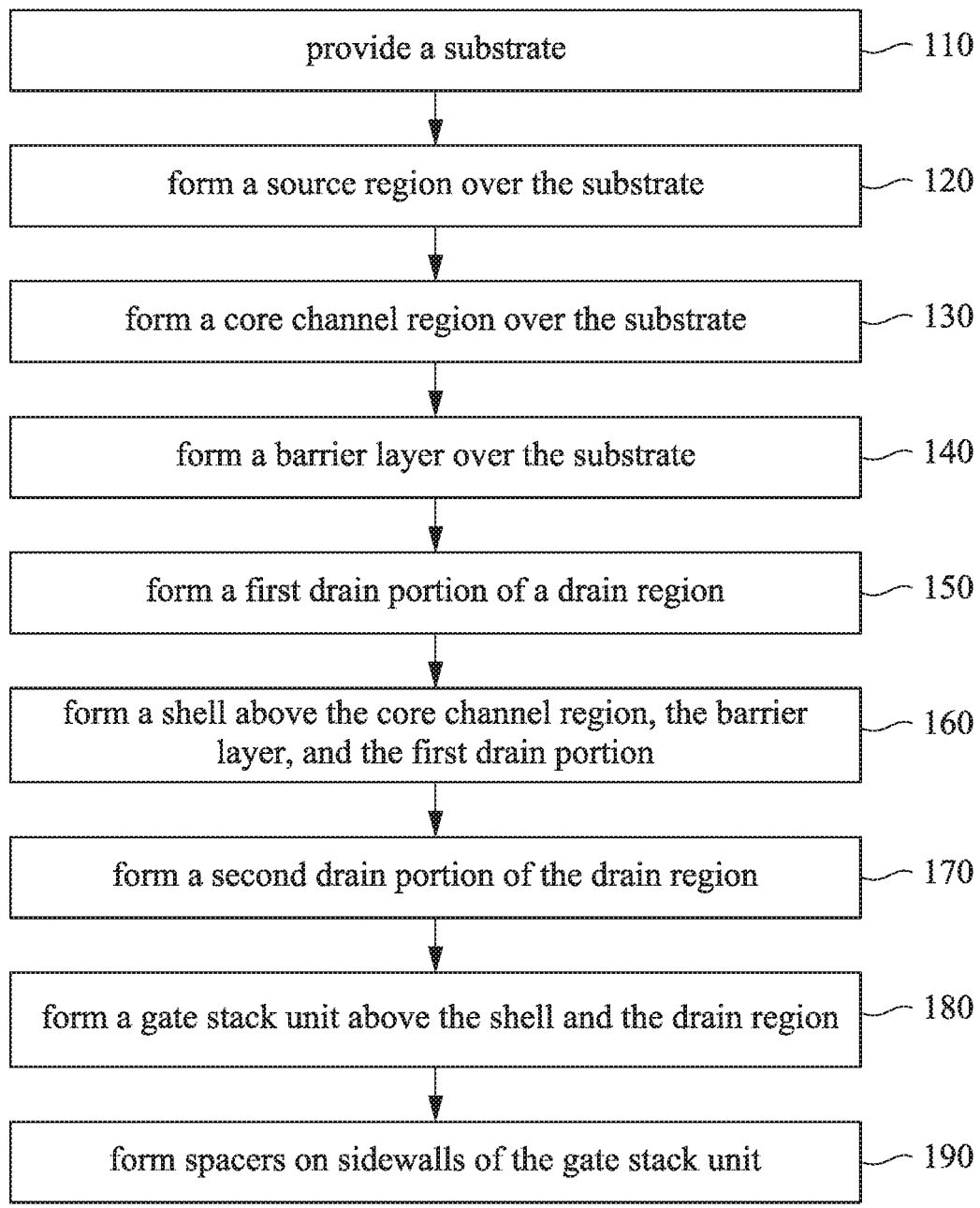
FIG. 1 is a flow chart of a method of manufacturing a semiconductor device in accordance with some embodiments of the present disclosure.
Figure 2:
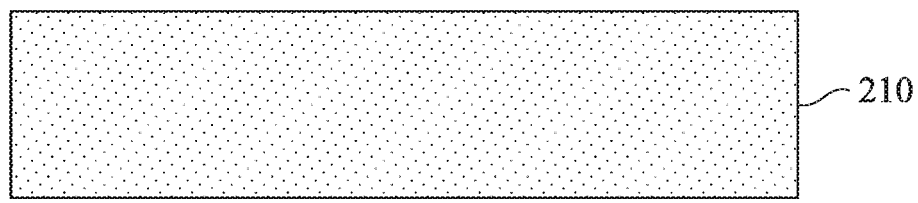
FIGS. 2 to 13 are cross-sectional views illustrating a semiconductor device at various stages of manufacturing in accordance with some embodiments of the present disclosure.
Figure 3:
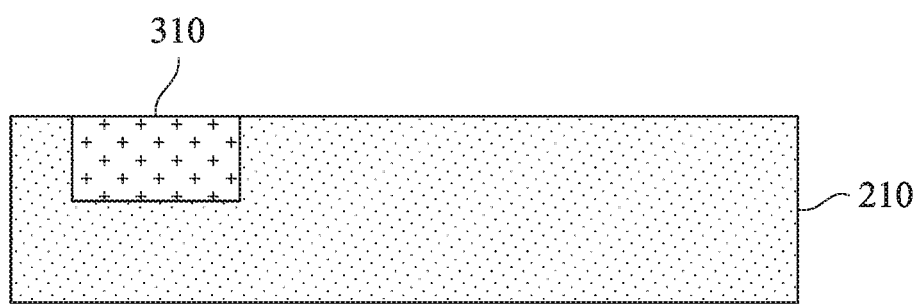
Figure 4:
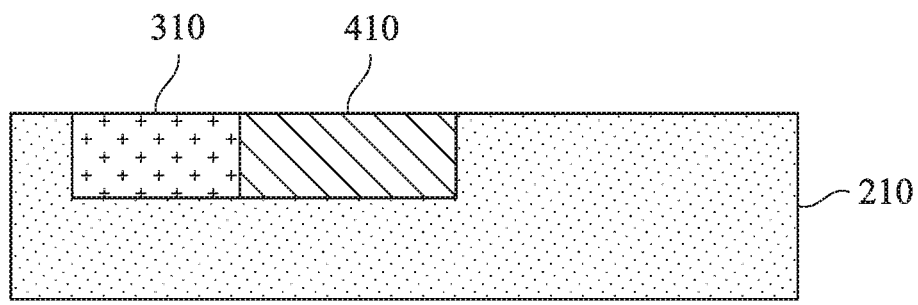

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 47:
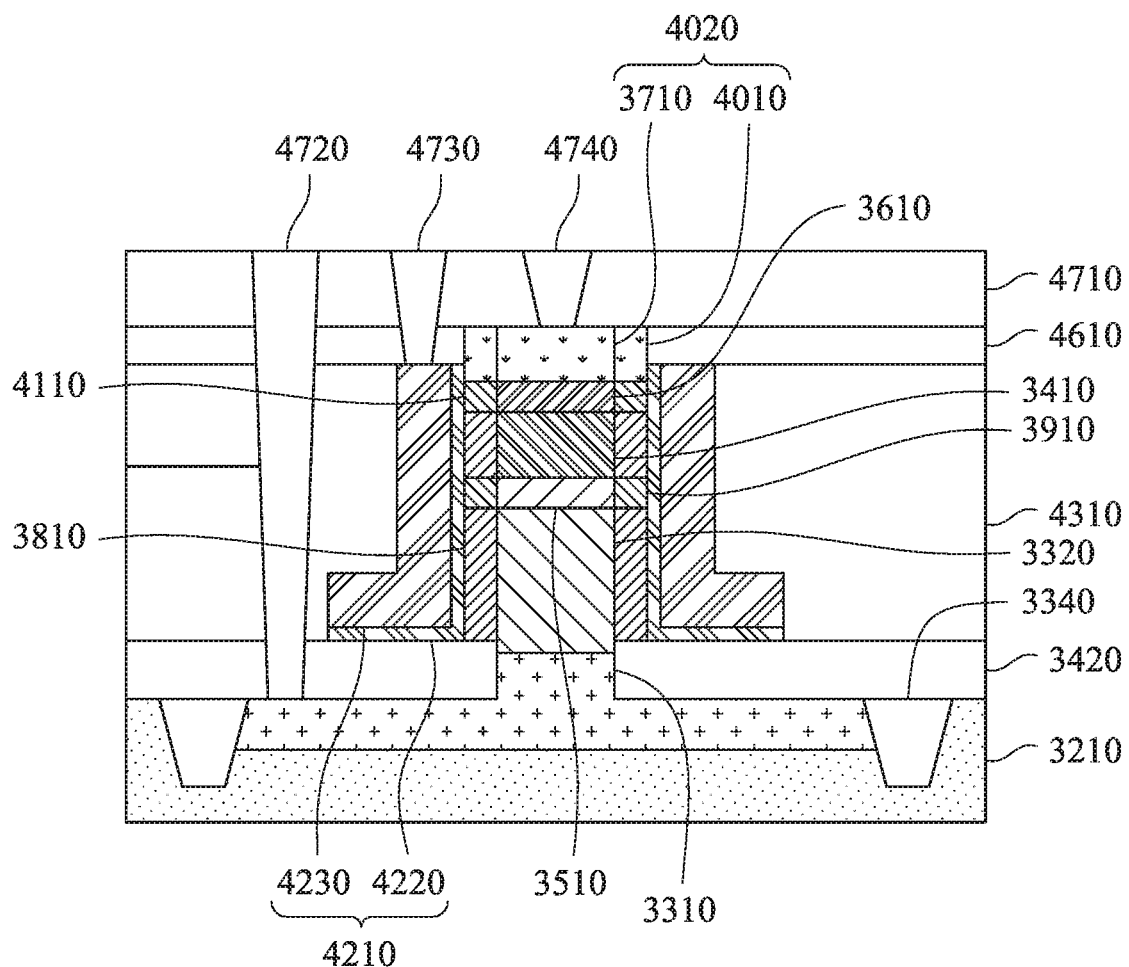

Some embodiments of the present disclosure provides systems and methods that align an energy band of a shell over a core channel region and an energy band of a shell over a barrier layer with each other and that suppress an interfacial energy band barrier related to piling up of charges at an interface between a barrier layer and channel/drain region of the semiconductor device. Such energy bands alignment and interfacial energy band barrier suppression enable high performance of the semiconductor device speed. In an exemplary embodiment, the semiconductor device (e.g., semiconductor devices of FIGS. 13, 14, 21-23, 25, 29, 30, 47-49 and 53) includes source and drain regions (e.g., source and drain regions 310, 1120 of FIGS. 13, 14, 21-23, 25, 29, and 30, source and drain regions 3310, 4020 of FIGS. 47, 48, and 49, and source and drain regions 3310, 5210 of FIG. 53), a core channel region (e.g., core channel region 410 of FIGS. 13, 14, 21-23, 25, 29, and 30 and core channel region 3320 of FIGS. 47-49 and 53) between the source and drain regions, a barrier layer (e.g., barrier layer 610 of FIGS. 13, 14, 21-23, 25, 29, and 30 and barrier layer 3410 of FIGS. 47-49 and 53) between the core channel region and the drain region, a shell (e.g., shell 1010 of FIGS. 13, 14, 21-23, 25, 29, and 30, shell 3810 of FIGS. 47-49 and shell 5110 of FIG. 53) over the core channel region and the barrier layer, and a gate stack unit (e.g., gate stack unit 1210 of FIGS. 13, 14, 21-23, 25, 29, and 30 and gate stack unit 4210 of FIGS. 47-49 and 53) over the shell. In some embodiments, the shell includes two portions. In such some embodiments, a first shell portion of the shell over the core channel region (e.g., first shell portion 2710 of FIGS. 29 and 30 and first shell portion 4810 of FIG. 48) includes a different material than a second shell portion of the shell over the barrier layer (e.g., second shell portion 2810 of FIGS. 29 and 30 and second shell portion 4820 of FIG. 48). In other embodiments, the gate stack unit includes a single gate stack (e.g., gate stack unit 1210 of FIGS. 13, 21, 23, 25, 29, and 30 and gate stack unit 4210 of FIG. 47, 48, and 53) or a pair of gate stacks (e.g., gate stacks 1410, 1420 of FIG. 14, gate stacks 2210 and 2220 of FIG. 22, and gate stacks 4910 and 4920 of FIG. 49).

In certain embodiments, at least one of the barrier layer and the shell is graded doped. For example, the barrier layer has a first doped portion adjacent the interface between the core channel region and the barrier layer (e.g., first doped portion 1710 of FIGS. 21-23, 25, and 29 and first doped portion 3510 of FIGS. 47-49 and 53) and a second doped portion adjacent the interface between the barrier layer and the drain region (e.g., second doped portion 1810 of FIGS. 21, 22, and 23 and second doped portion 3610 of FIGS. 47-49 and 53). A dopant concentration of at least one of the first and second doped portions of the barrier layer is higher than a dopant concentration of the barrier layer between the first and second doped portions of the barrier layer. The shell has a first doped portion over the first doped portion of the barrier layer (e.g., first doped portion 1910 of FIGS. 21-23, 25, and 30 and first doped portion 3910 of FIGS. 47-49 and 53) and a second doped portion above the second portion of the barrier layer (e.g., second doped portion 2010 of FIGS. 21-23, 25, and 30 and second doped portion 4110 of FIGS. 47-49 and 53). A dopant concentration of at least one of the first and second doped portions of the shell is higher than a dopant concentration of the shell between the first and second doped portion s of the shell.

Illustrated in FIG. 1 is a flow chart of a method 100 of manufacturing a semiconductor device in accordance with some embodiments of the present disclosure. FIGS. 2 to 13 are cross-sectional views illustrating a semiconductor device at various stages of manufacturing in accordance with some embodiments of the present disclosure. The semiconductor device shown in FIGS. 2 to 13 may be intermediate devices fabricated during processing of an integrated circuit (IC), or a portion thereof, that may include static random access memory (SRAM), logic circuits, passive components, such as resistors, capacitors, and inductors, and/or active components, such as p-type FETs (PFETs), n-type FETs (NFETs), multi-gate FETs, bipolar transistors, high voltage transistors, high frequency transistors, other memory cells, and combinations thereof. In some embodiments, the semiconductor device shown in FIGS. 2 to 13 has a horizontal transistor structure.

The method 100 begins at block 110 where a substrate is provided. Referring to the example of FIG. 2, in some embodiments of block 110, a substrate 210 is provided. The substrate 210 may be a semiconductor substrate such as a silicon substrate. The substrate 210 may include various layers, including conductive or insulating layers formed on the substrate 210. The substrate 210 may include various doping configurations depending on design requirements as is known in the art. The substrate 210 may also include other semiconductors such as germanium, silicon carbide (SiC), silicon germanium (SiGe), or diamond. Alternatively, the substrate 210 may include a compound semiconductor and/or an alloy semiconductor. Further, in some embodiments, the substrate 210 may include an epitaxial layer (epi-layer), the substrate 210 may be strained for performance enhancement, the substrate 210 may include a silicon-on-insulator (SOI) structure, and/or the substrate 210 may have other suitable enhancement features.

The method 100 proceeds to block 120 where a source region is formed over the substrate 210. Referring to the example of FIG. 3, in some embodiments of block 120, a source region 310 is formed over the substrate 210. The source region 310 may be formed by a photolithography process, an ion implantation process, an annealing process, a diffusion process, an epitaxial growth process, or a combination thereof. For example, the region where the source region 310 is to be formed can be removed using a removal process such as an etching process. The source region 310 can then be epitaxial grown within the recess formed by the removal process. In some examples, the source region 310 can be doped in-situ.

The method 100 proceeds to block 130 where a core channel region is formed over the substrate 210 adjacent the source region 310. Referring to the example of FIG. 4, in some embodiments of block 130, a core channel region 410 is formed over the substrate 210. In some embodiments, the core channel region 410 may include the same material as the substrate 210. In other embodiments, the core channel region 410 may include a high-mobility material. A high-mobility material is a material that has a higher mobility than silicon. High-mobility materials include SiGe, indium arsenide (InAs), indium antimonide (InSb), and the like. In certain embodiments, the core channel region 410 may include a high-mobility material grown (e.g., by an epitaxial growth process) on the substrate 210. In various embodiments, the substrate 210 may include a material different from the core channel region 410 material.

The core channel region 410 may be formed in a variety of ways. For example, in the case of a planar transistor device, the core channel region 410 may be formed by doping a region of the substrate with a dopant, the type of which depends on the type of transistor. In the case of a finFET (fin Field Effect Transistor), the core channel region 410 is formed as a fin structure. In the case of a nanowire transistor, the core channel region 410 is formed as part of a nanowire structure.

The core channel region 410 is doped with first dopants and the source region 310 may be doped with second dopants having the same conductivity type as the first dopants. In some embodiments, in which the semiconductor device is an n-type transistor, the first and second dopants are p-type dopants. In other embodiments, in which the semiconductor device is a p-type transistor, the first and second dopants are n-type dopants. In an exemplary embodiment, a doping concentration of the second dopants of the source region 310 is lower than a doping concentration of the first dopants of the core channel region 410. For example, the doping concentration of the second dopants of the source region 310 may be from about $1 \times 1017/cm^3$ to about $5 \times 1020/cm^3$. For example, the doping concentration of the first dopants of the core channel region 410 may be from about $5 \times 1018/cm^3$ to about $1 \times 1021/cm^3$.

The method 100 proceeds to block 140 where a barrier layer is formed over the substrate 210 such that the core channel region 410 is between the source region 310 and the barrier layer. Referring to the example of FIG. 5, in some embodiments of block 140, the substrate 210 is first patterned and etched, such as by a photolithographic process, an electron beam (e-beam) lithographic process, or a combination thereof. For example, with reference to FIG. 5, the photolithographic process may include forming a photoresist layer (resist) 510 overlying the substrate 210, exposing the resist 510 to a pattern, performing post-exposure bake processes, and developing the resist 510 to form a masking element including the resist 510. In some embodiments, patterning the resist 510 to form the masking element may be performed using an e-beam lithography process. The masking element may then be used to protect regions of the substrate 210 while an etch process forms a recess 520 into the substrate 210. In an exemplary embodiment, the substrate 210 and the core channel region 410 define the recess 520. The etching used to form the recess 520 may include a dry etch, a wet etch, or a combination thereof.

Figure 6:
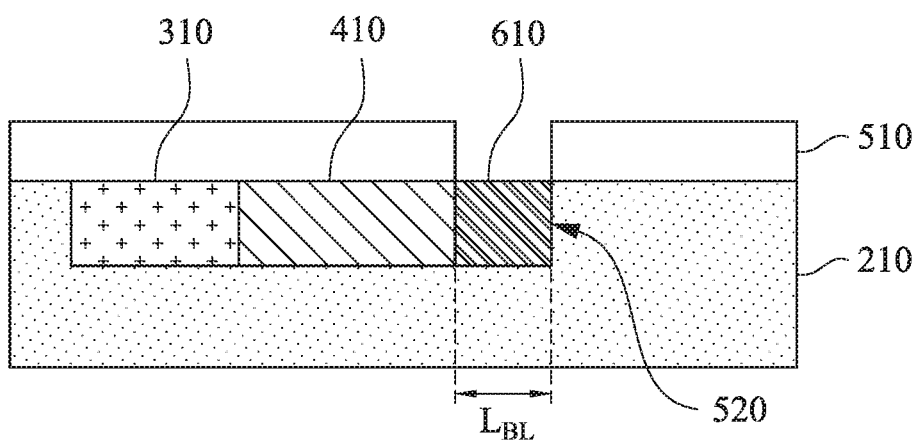

After the substrate 210 is patterned and etched, referring to the example of FIG. 6, in some embodiments of block 140, a barrier layer 610 is formed in the recess 520 in the substrate 210. In some embodiments, the barrier layer 610 is grown within the recess 520. In such some embodiments, the barrier layer 610 is grown using an epitaxial growth process such as molecular beam epitaxy (MBE), metalorganic chemical vapor deposition (MOCVD), and/or other suitable growth process. Examples of materials for the barrier layer 610 include, but are not limited to, SiGe, strained Ge, Ge, GaAs, GaP, InP, InAs, InSb, GaAsP, InAlAs, AlGaAs, InGaAs, GaInP, GaInAsP, or combinations thereof.

In some embodiments, the barrier layer 610 may include a different material than the core channel region 410. For example, the barrier layer 610 includes a material having a larger band gap than a material of the core channel region 410. Thus, a heterojunction is formed at an interface between the barrier layer 610 and the core channel region 410. The heterojunction at the interface between the barrier layer 610 and the core channel region 410 results in a band offset (e.g., a conduction band offset or a valence band offset) at the heterojunction that will impact the source-drain current flow through the core channel region 410. Such a band offset may result in a suppressed and/or significantly decreased BTBT (band-to-band tunneling) current, minimizing a leakage current in the off-state of the semiconductor device. The length $L_{BL}$ of the barrier layer 610 can be adjusted to minimize the leakage. For example, the longer the length $L_{BL}$, the lower the leakage current in a given material system. In some embodiments, the length $L_{BL}$ of the barrier layer 610 is about 20 nm to about 35 nm.

In other embodiments, the barrier layer 610 includes the same material as the core channel region 410. In such other embodiments, the barrier layer 610 and the core channel region 410 have opposite conductivity types in order to create the band offset at the interface of the barrier layer 610 and the core channel region 410.

In some embodiments, the barrier layer 610 is intrinsic. In other embodiments, the barrier layer 610 is doped. In such other embodiments, after the barrier layer 610 is formed, the barrier layer 610 is doped with third dopants having the same conductivity type as the first dopants of the core channel region 410. For example, the barrier layer 610 may be in-situ doped during the epitaxial growth process of the barrier layer 610. Alternatively, the barrier layer 610 may be doped after the formation of the barrier layer 610. In the case of an n-type transistor, the barrier layer 610 may be doped with p-type dopants. For example, the p-type dopant is Zn if the barrier layer 610 is made of GaSb, and the p-type dopant is C if the barrier layer 610 is made of GaAs. In the case of a p-type transistor, the barrier layer 610 may be doped with n-type dopants. For example, the n-type dopant is S (Se and Sn may also be used) if the barrier layer 610 is made of InAs, and the n-type dopant is Si if the barrier layer 610 is made of GaAs. In certain embodiments, the third dopants of the barrier layer 610 have a conductivity type opposite to the conductivity type of the first dopants of the core channel region 410. In some embodiments, a doping concentration of the third dopants of the barrier layer 610 is lower than the doping concentration of the first dopants of the core channel region 410. For example, the doping concentration of the third dopants of the barrier layer 610 may have a doping concentration greater than about $5 \times 10^{18}/cm^3$ (about $5 \times 10^{19}/$ cm³ for example), and the core channel region 410 may have a doping concentration ranging from about $1\times10^{20}/cm^3$ to about $1\times10^{21}/cm^3$.

The method 100 proceeds to block 150 where a first drain portion is formed over the substrate 210 such that the barrier layer 610 is between the core channel region 410 and the first drain portion. Referring to the example of FIG. 7, in some embodiments of block 150, a recess 720 is formed in the substrate 210 defined by the barrier layer 610 and the substrate 210. Specifically, after the barrier layer 610 is formed, the resist 510 is removed. A resist 710 is formed over the substrate 210 to cover the source region 310, the core channel region 410, and the barrier layer 610. An opening 730 is formed in the resist 710. The opening 730 exposes a portion of the substrate 210 adjacent the barrier layer 610. An etching process is performed to remove the portion of the substrate 210 exposed by the opening 730. The recess 720 is formed in the substrate 210 using the resist 710 as an etch mask.

Figure 8:
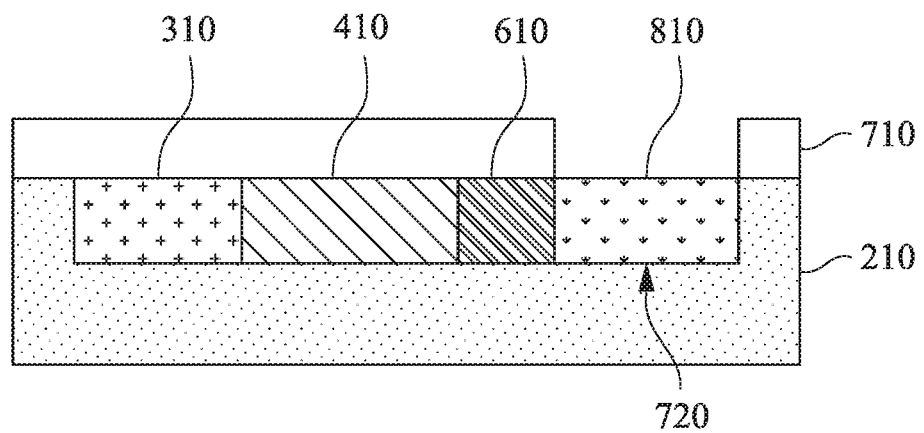
Figure 9:
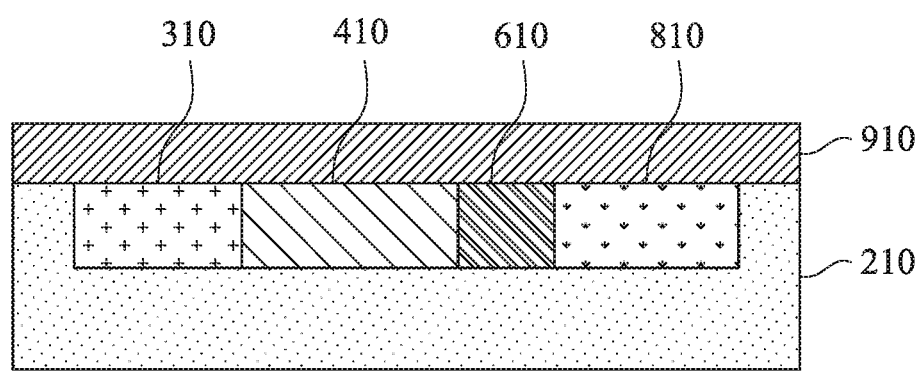

After the recess 720 is formed, referring to the example of FIG. 8, in some embodiments of block 150, a first drain portion 810 of a drain region (e.g., drain region 1120 of FIG. 11) is formed in the recess 720 adjacent the barrier layer 610. The first drain portion 810 is formed in the substrate 210 such that the barrier layer 610 is between the core channel region 410 and the first drain portion 810.

The first drain portion 810 may be doped with fourth dopants having a conductivity type opposite to the conductivity type of the first dopants of the core channel region 410. In some embodiments, in which the semiconductor device is an n-type transistor, the fourth dopants are n-type dopants. For example, the n-type dopant is Si if the first drain portion 810 is made of InAs. In other embodiments, in which the semiconductor device is a p-type transistor, the fourth dopants are p-type dopants. For example, the p-type dopant is Zn if the first drain portion 810 is made of GaSb.

The method 100 proceeds to block 160 where a shell is formed above the core channel region 410, the barrier layer 610, and the first drain portion 810. Referring to the example of FIG. 9, in some embodiments of block 160, a semiconductor material 910 is formed over the substrate 210 to cover the source region 310, the core channel region 410, the barrier layer 610, and the first drain portion 810. Specifically, after the first drain portion 810 is formed, the resist 710 is removed. The semiconductor material 910 is formed on a top surface of the source region 310, a top surface of the core channel region 410, a top surface the barrier layer 610, and a top surface of the first drain portion 810.

Figure 10:
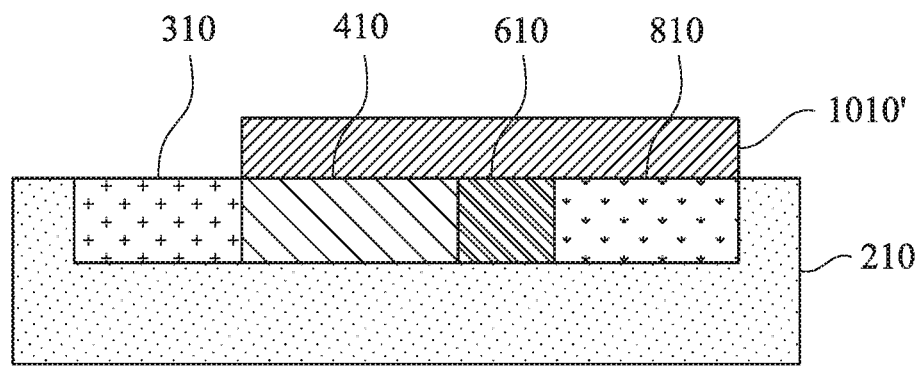
Figure 11:
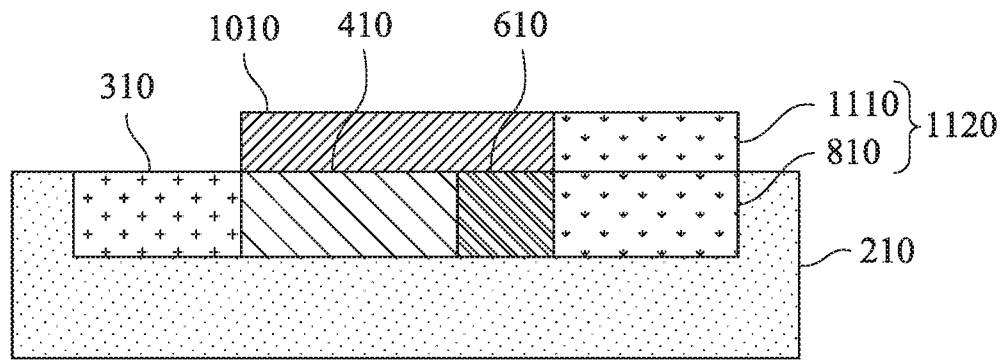
Figure 12:
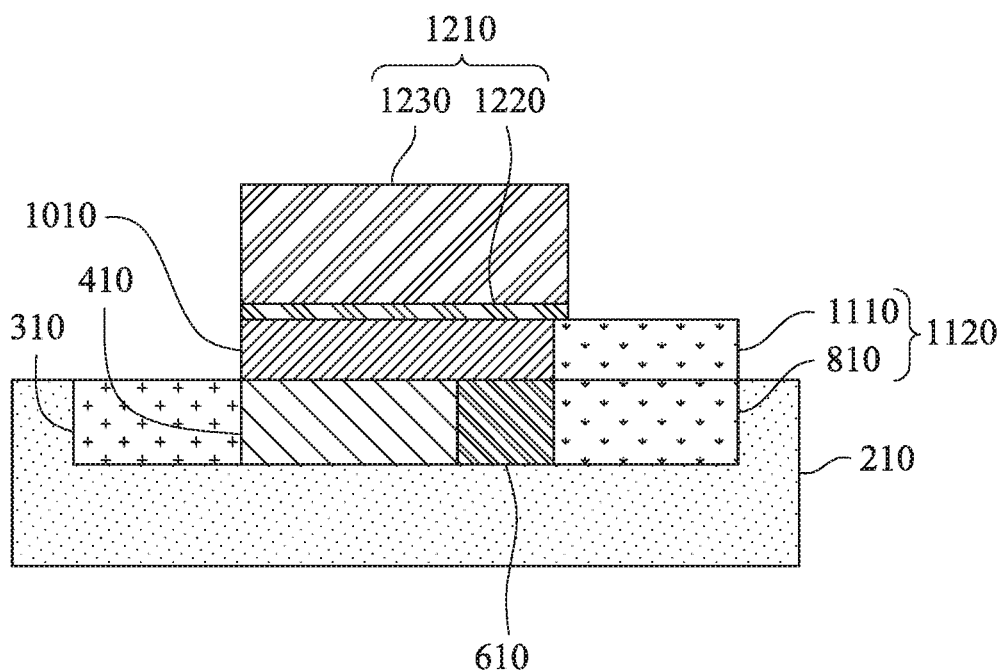

Referring to the example of FIG. 10, in some embodiments of block 160, the semiconductor material 910 is patterned and etched. A shell 1010' is then formed above the core channel region 410, the barrier layer 610, and the first drain portion 810. In some embodiments, the shell 1010' may include a different material from the core channel region 410. The shell 1010' may be intrinsic or doped. In other embodiments, the shell 1010' may include the same material as the core channel region 410. In such other embodiments, the shell 1010' and the core channel region 410 have opposite conductivity types in order to create a PN junction between the shell 1010' and the core channel region 410.

The method 100 proceeds to block 170 where a second drain portion of the drain region 1120 is formed above the first drain portion 810 by doping a portion of the shell 1010' over the first drain portion 810. Referring to the example of FIG. 11, in some embodiments of block 170, the portion of the shell 1010' above the first drain portion 810 is doped with the same dopants as the first drain portion 810, i.e., fourth dopants, to form a second drain portion 1110 such that a shell 1010 is formed over the core channel region 410 and the barrier layer 610. In some embodiments, the doping concentration of the fourth dopants in the shell 1010' is substantially the same as the doping concentration of the fourth dopants in the first drain portion 810. The second drain portion 1110 and the first drain portion 810 form a drain region 1120 of the semiconductor device. In some embodiments, the drain region 1120 is a diffused drain region, an ion implanted drain region, an epitaxially grown drain region, or a combination thereof. In other embodiments, the drain region 1120 is a graded doped drain region. For example, the drain region 1120 includes a first portion, e.g., a portion of the drain region 1120 proximate the barrier layer 610, that has a higher fourth dopants concentration than a second portion of the drain region 1120 distal the barrier layer 610.

The formation of the source region 310, the core channel region 410, the barrier layer 610, the first and second drain portions 810 and 1110, and the shell 1010 may be in different sequences to those described above. For example, the first and second drain portions 810 and 1110 of the drain region 1120 are formed at the same time. The formation of the source region 310 is after the formation of at least one of the core channel region 410, the barrier layer 610, and the shell 1010. The formation of the drain region 1120 is before the formation of at least one of the core channel region 410, the barrier layer 610, and the shell 1010.

The selection of a material for each of the core channel region 410, the barrier layer 610, the source region 310, the shell 1010, and the drain region 1120 depends on whether the semiconductor device is implemented as an n-type or p-type device. In some examples, for p-type devices, the barrier layer 610 includes GaAs, AlSb, or InGaAs. The core channel region 410 and the source region 310 include InAs. The shell 1010 and the drain region 1120 include GaSb. In other examples, for p-type devices, the barrier layer 610 includes InAlAs. The core channel region 410 and the source region 310 include InGaAs. The shell 1010 and the drain region 1120 include GaAsSb. In various examples, for p-type devices, the barrier layer 610 includes GaAs, AlSb, or InGaAs. The core channel region 410 and the source region 310 include InAs. The shell 1010 and the drain region 1120 include InAs.

In some examples, for n-type devices, the barrier layer 610 includes AlSb, InAlSb, GaAs or InGaAs. The core channel region 410 and the source region 310 include GaSb, GaAsSb or InGaSb. The shell 1010 and the drain region 1120 include InAs, InGaAs or InSb. In other examples, for n-type devices, the barrier layer 610 includes Si or SiGe. The core channel region 410 and the source region 310 include Ge. The shell 1010 and the drain region 1120 include Si. In various examples, for n-type devices, the barrier layer 610 includes Si, SiGe, or InP. The core channel region 410 and the source region 310 include Ge. The shell 1010 and the drain region 1120 include Si.

The method 100 proceeds to block 180 where a gate stack unit is formed above the shell 1010 and the drain region 1120. Referring to the example of FIG. 12, in some embodiments of block 180, a gate stack unit 1210 is formed on a top surface of the shell 1010 and a top surface of the drain region 1120. It is noted that the gate stack unit 1210 overlaps a portion of the drain region 1120 which results in suppression of an interfacial energy band barrier at an interface between the barrier layer 610 and the core channel region 410/drain region 1120 of the semiconductor device. In some embodiments, a length of the gate stack unit 1210 that overlaps the drain region 1120 is equal to or greater than about 2 nm. In other embodiments, the length of the gate stack unit 1210 that overlaps the drain region 1120 is equal to or less than about 7 nm. In certain embodiments, the length of the gate stack unit 1210 that overlaps the drain region 1120 ranges from about 3 nm to about 6 nm.

The gate stack unit 1210, in this exemplary embodiment, includes a single gate stack that has a gate dielectric layer 1220 and a gate electrode 1230. In some embodiments, the gate dielectric layer 1212 includes a high-K gate dielectric, i.e. a dielectric material having a high dielectric constant, for example, greater than that of thermal silicon oxide (~3.9). In other embodiments, the gate dielectric layer 1220 further includes an interfacial layer not shown) underlying the high-K gate dielectric. Examples of materials for the gate dielectric layer 1220 include, but are not limited to, $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HiZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or a combination thereof. The gate dielectric layer 1220 may be formed by atomic layer deposition (ALD), physical vapor deposition (PVD), chemical vapor deposition (CVD), oxidation, and/or other suitable deposition techniques.

The gate electrode 1230 may include a single layer or alternatively a multi-layer structure, such as various combinations of a metal layer with a selected work function to enhance the device performance. Examples of materials for the metal gate 1214 include, but are not limited to, Ti, Ag, Al, TiAlN, TaC, TaCN, TaSiN, Mn, Zr, TiN, TaN, Ru, Mo, Al, WN, Cu, W, Re, Ir, Co, Ni, or a combination thereof. The gate electrode 1230 may be formed by ALD, PVD, CVD, e-beam evaporation, or other suitable process. Further, the gate electrode 1230 may be formed separately for N-FET and P-FET transistors which may use different metal layers. In various embodiments, a CMP process may be performed to remove excessive metal from the gate electrode 1230, and thereby provide a substantially planar top surface of the gate electrode 1230.

The method 100 proceeds to block 190 where spacers are formed on opposite sidewalls of the gate stack unit 1210, respectively. Referring to the example of FIG. 13, in some embodiments of block 180, a spacer 1310 is formed on a first sidewall of the gate stack unit 1210, a sidewall of the shell 1010, and the top surface of the source region 310. A spacer 1320 is formed on a second sidewall of the gate stack unit 1210 opposite the first sidewall and the top surface of the drain region 1120. In an exemplary embodiment, the spacers 1310, 1320 include a low-k dielectric material. For example, the low-k dielectric material is blanket deposited over the substrate 210. The low-k dielectric material is then patterned to remove excess portion on the top surface of the gate stack unit 1210, the top surface of the drain region 1120, and the top surface of the substrate 210.

Figure 13:
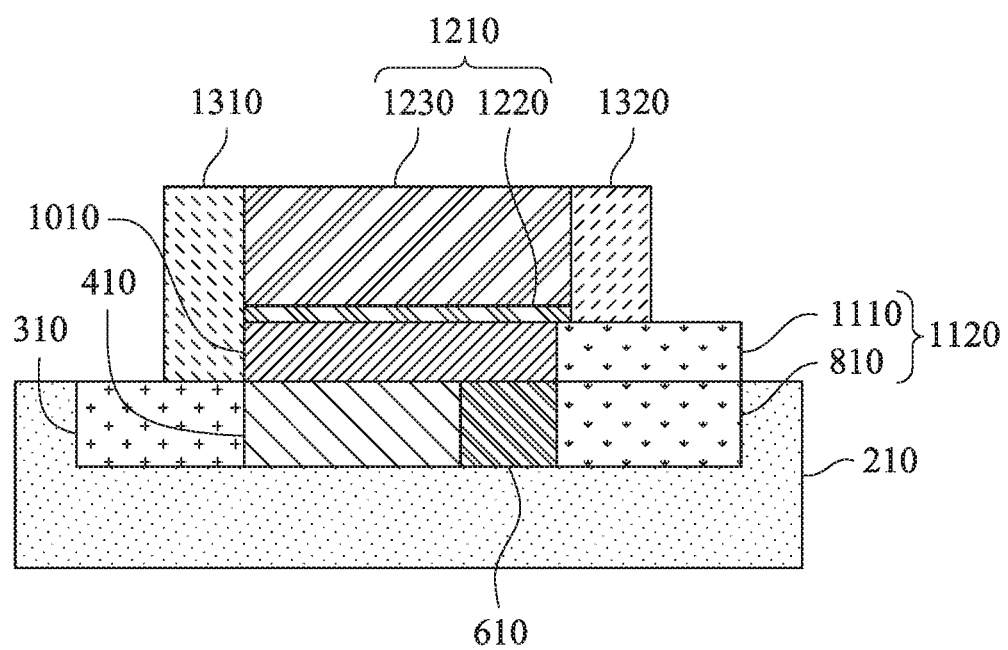

As shown in FIG. 13, the spacer 1310 has a larger thickness than the spacer 1320 because the spacer 1310 stands on the substrate 210, whereas the spacer 1320 stands on the drain region 1120. The thickness of the spacer 1310 is measured of the combined thicknesses of the shell 1010 and the gate stack unit 1210. The thickness of the spacer 1320 has the same thickness as the gate stack unit 1210. In some embodiments, the spacer 1310 may further stand on the core channel region 410. In other embodiments, the spacer 1320 may be omitted.

Figure 14:
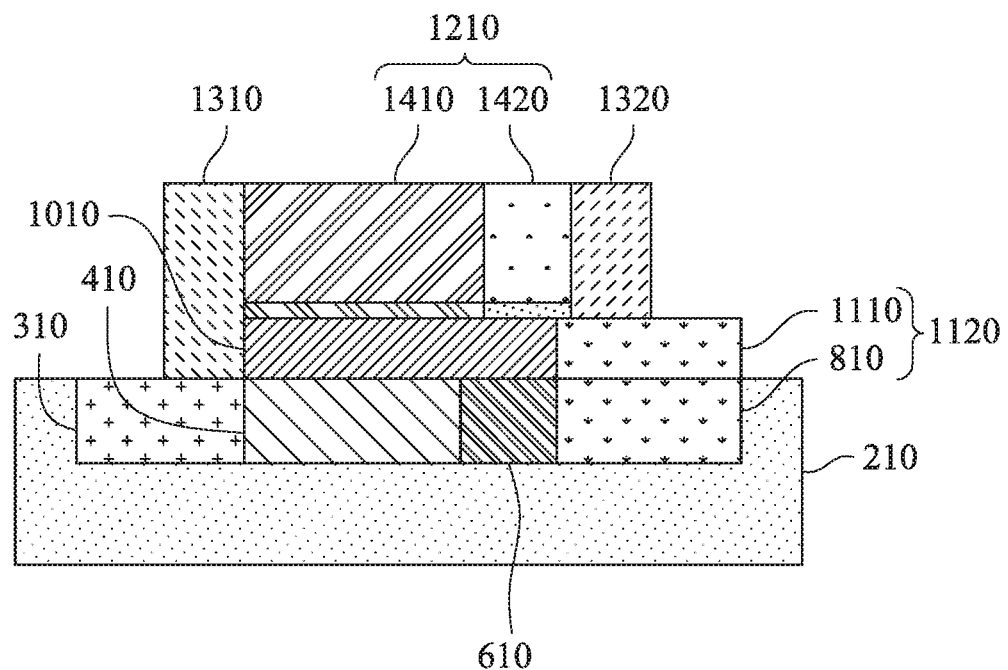
FIG. 14 is a cross-sectional view illustrating a semiconductor device in accordance with some embodiments of the present disclosure.

In some embodiments, as illustrated in FIG. 14, the gate stack unit 1210 includes a pair of gate stacks 1410, 1420. FIG. 14 is a cross-sectional view illustrating a dual gate stack semiconductor device in accordance with some embodiments of the present disclosure. In such some embodiments, the gate stack 1410 overlaps the core channel region 410 and the barrier layer 610. The gate stack 1420 overlaps the barrier layer 610 and the drain region 1120. In other embodiments, the gate stack unit 1210 may surround the core channel region 410, the barrier layer 610, and the drain region 1120.

The semiconductor device may undergo further processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 15:
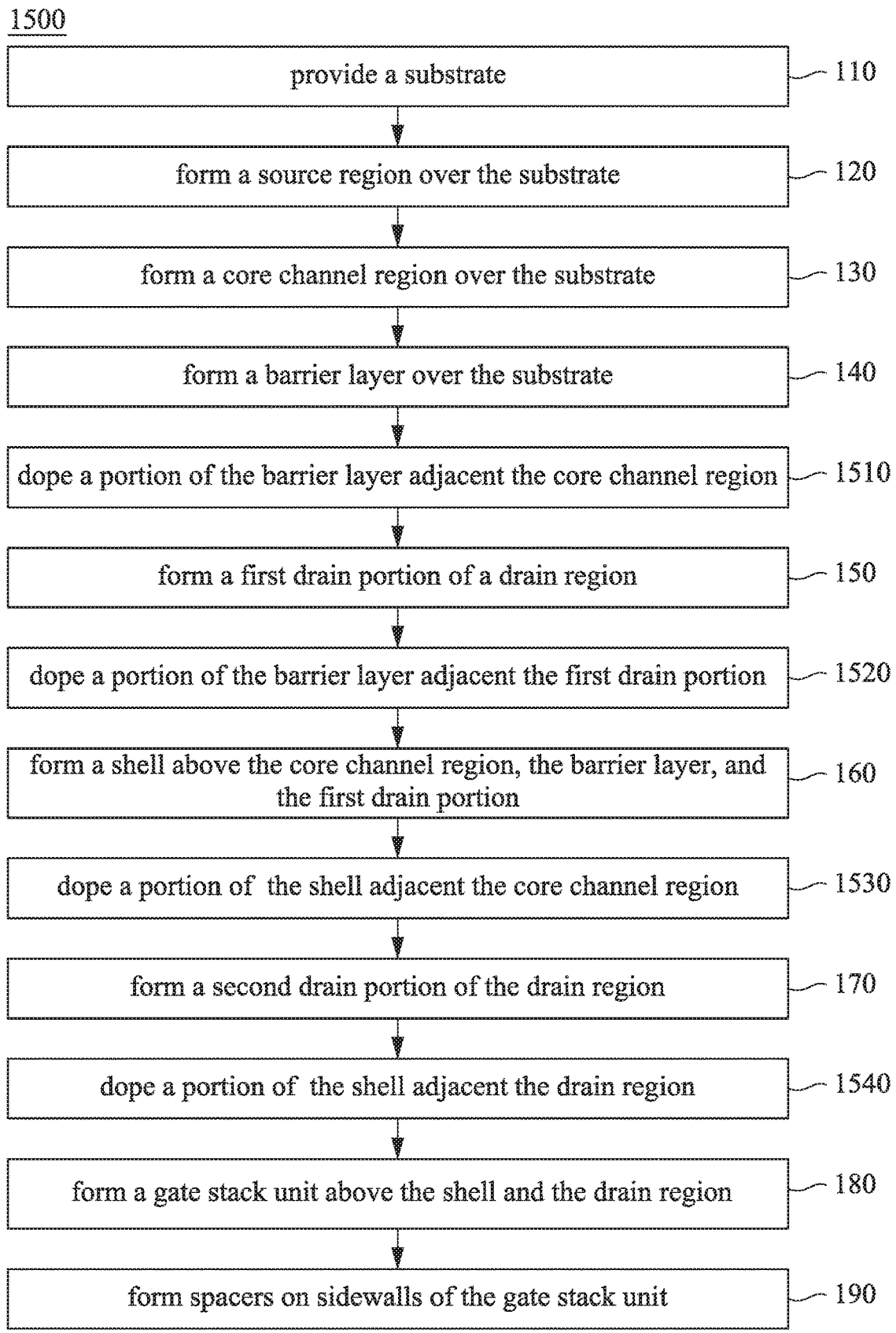
FIG. 15 is a flow chart of a method of manufacturing a semiconductor device in accordance with some embodiments of the present disclosure.
Figure 16:
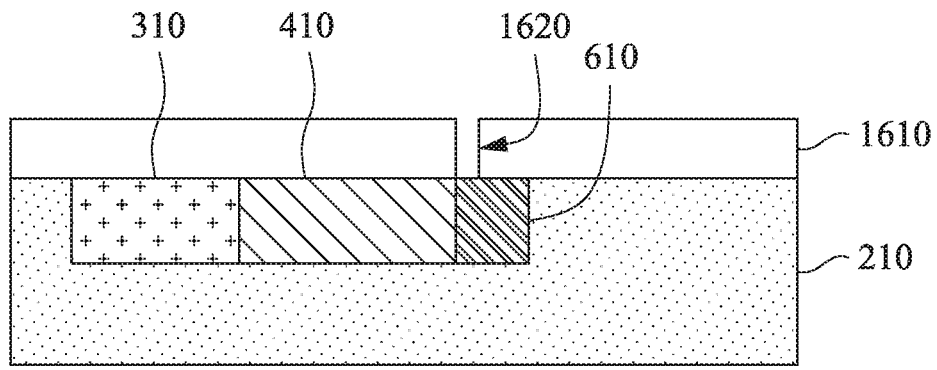
FIGS. 16 to 21 are cross-sectional views illustrating a semiconductor device at various stages of manufacturing in accordance with some embodiments of the present disclosure.

It is understood that additional operations may be implemented before, during, and after the method 100, and some of the operations described may be replaced or eliminated for other embodiments of the method 100. For example, illustrated in FIG. 15 is a flow chart of a method 1500 of manufacturing a semiconductor device in accordance with some embodiments of the present disclosure. FIGS. 16 to 21 are cross-sectional views illustrating a semiconductor device at various stages of manufacturing in accordance with some embodiments of the present disclosure.

Because blocks 110-190 of method 1500 are similar to those described above with respect to blocks 110-190 of method 100, a detailed description thereof is dispensed herewith for the sake of brevity.

Method 1500 differs from method 100 in that method 1500 further includes blocks 1510, 1520, 1530, and 1540 where the barrier layer 610 and the shell 1010 are doped with dopants, thereby forming a graded doped barrier layer 610 and a graded doped shell 1010.

Figure 5:
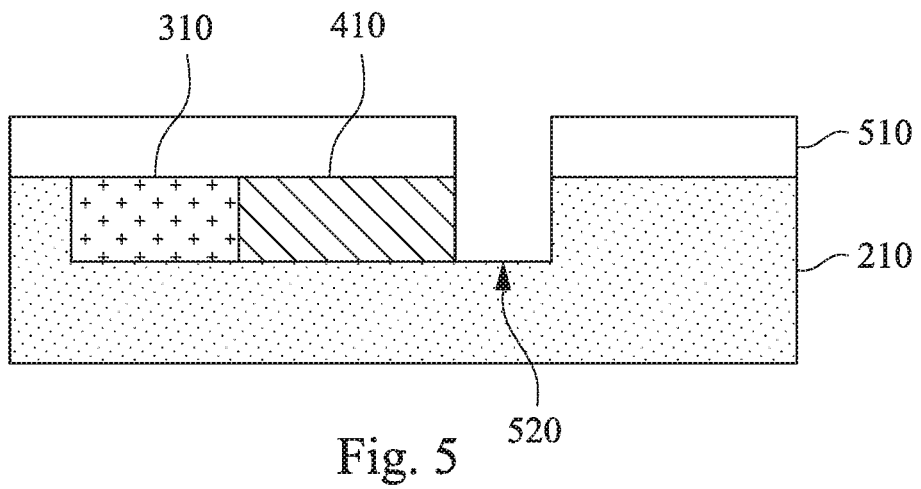

After block 140 where the barrier layer 610 is formed, the method 1500 proceeds to block 1510 where a portion of the barrier layer 610 adjacent an interface between the core channel region 410 and the barrier layer 610 is doped with fifth dopants. Referring to the example of FIG. 16, in some embodiments of block 1510, the resist 510 of FIG. 5 is removed. A resist 1610 is formed over the substrate 210 to cover the source region 310, the core channel region 410, and the barrier layer 610. An opening 1620 is formed in the resist 1610. The opening 1620 exposes a portion of the barrier layer 610 adjacent an interface between the core channel region 410 and the barrier layer 610.

Figure 17:
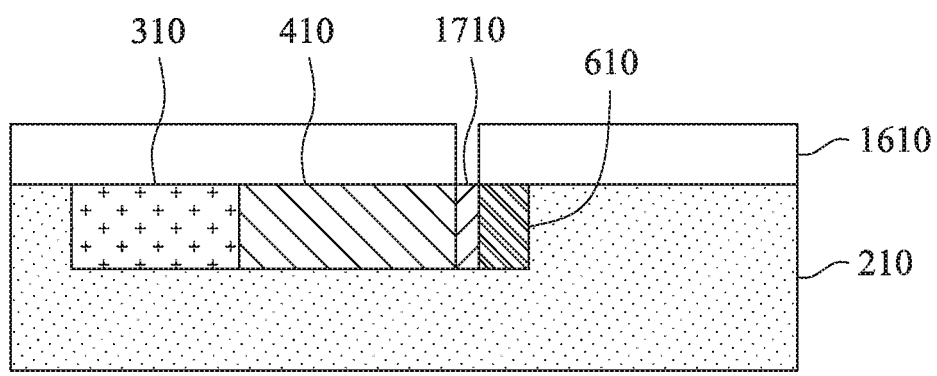
Figure 18:
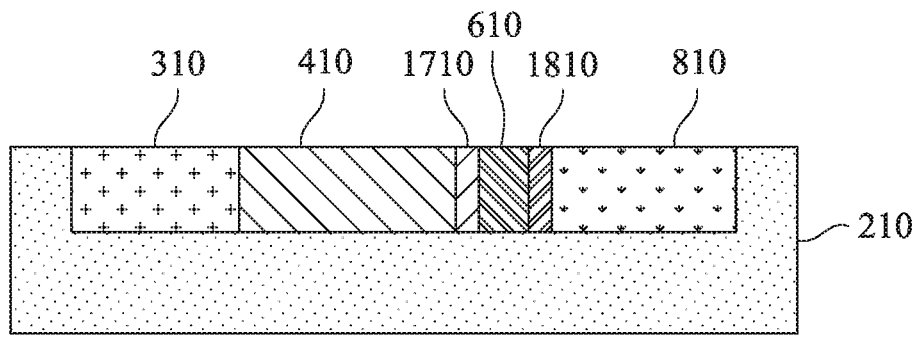
Figure 19:
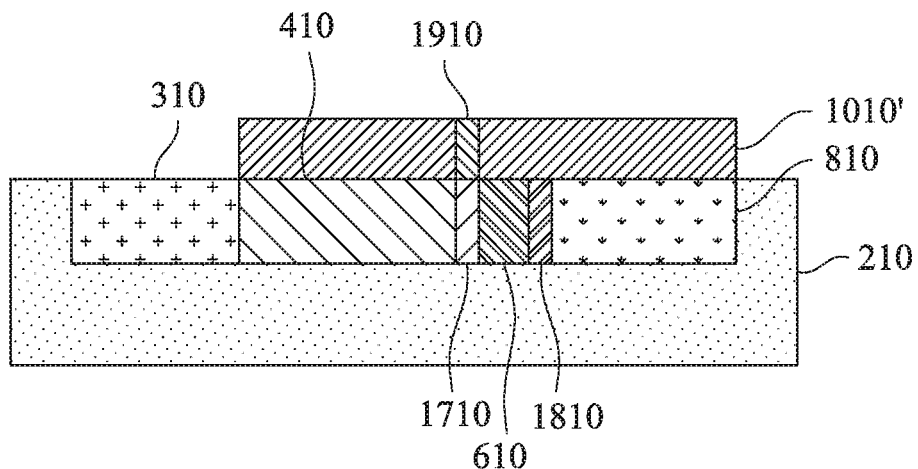
Figure 20:
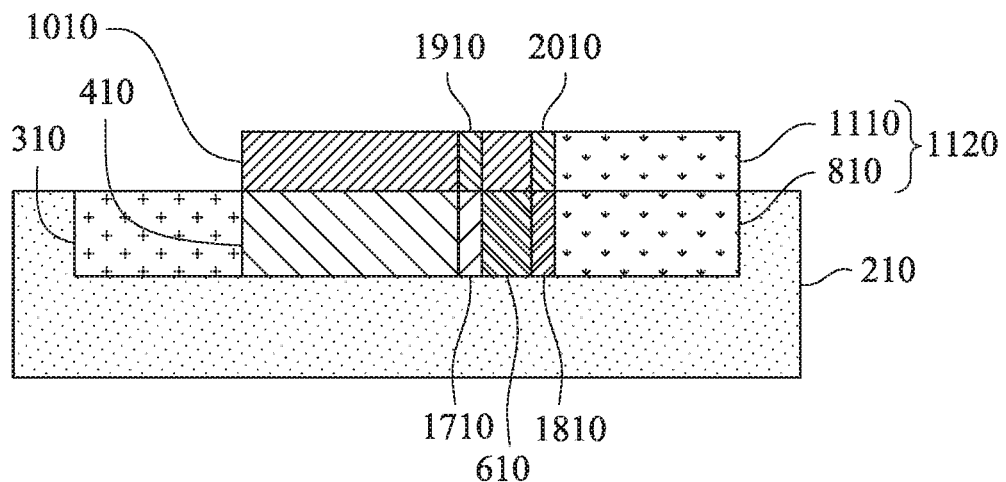

Referring to the example of FIG. 17, in some embodiments of block 1510, the portion of the barrier layer 610 exposed by the opening 1620 is doped with fifth dopants having the same conductivity type as the first dopants of the core channel region 410. As a result, a first doped portion 1710 is formed in the barrier layer 610. In some embodiments, in which the semiconductor device is an n-type transistor, the fifth dopants are p-type dopants. For example, the p-type dopant is Be if the barrier layer 610 is made of GaAs. In other embodiments, in which the semiconductor device is a p-type transistor, the fifth dopants are n-type dopants. For example, the n-type dopant is Si if the barrier layer 610 is made of GaAs. It is noted herein that, during block 1510, the fifth dopants may diffuse into the core channel region 410.

In some embodiments, a doping concentration of the fifth dopants of the first doped portion 1710 of the barrier layer 610 is substantially the same as the doping concentration of the first dopants of the core channel region 410. For example, the doping concentration of the fifth dopants of the first doped portion 1710 of the barrier layer 610 is about $5 \times 10^{18}/cm^3$ to about $1 \times 10^{21}/cm^3$.

Figure 7:
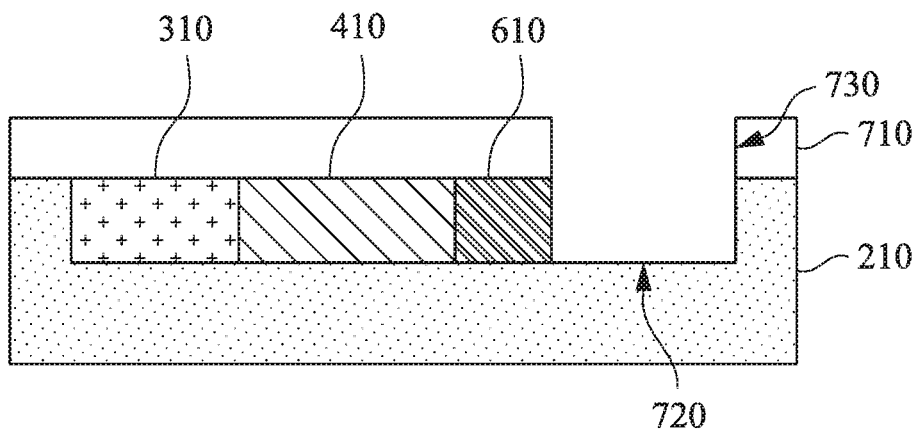

After block 150 where the first drain portion 810 is formed adjacent the barrier layer 610, the method 1500 proceeds to block 1520 where a portion of the barrier layer 610 adjacent an interface between the first drain portion 810 and the barrier layer 610 is doped with sixth dopants. Referring to the example of FIG. 18, in some embodiments of block 1520, the resist 710 of FIG. 7 is removed. A portion of the barrier layer 610 adjacent an interface between the first drain portion 810 and the barrier layer 610 is doped with sixth dopants having the same conductivity type as the fourth dopants of the first drain portion 810. As a result, a second doped portion 1810 is formed in the barrier layer 610. In some embodiments, in which the semiconductor device is an n-type transistor, the sixth dopants are n-type dopants. For example, the n-type dopant is Si if the barrier layer 610 is made of GaAs. In other embodiments, in which the semiconductor device is a p-type transistor, the sixth dopants are p-type dopants. For example, the p-type dopant is Be if the barrier layer 610 is made of GaSb. It is noted herein that, during block 1520, the sixth dopants may diffuse into the first drain portion 810.

In some embodiments, a doping concentration of the sixth dopants of the second doped portion 1810 of the barrier layer 610 is equal to or greater than a doping concentration of the fourth dopants of the first drain portion 810. For example, the doping concentration of the sixth dopants of the second doped portion 1810 of the barrier layer 610 is from about $5 \times 10^{18}/cm^3$ to about $1 \times 10^{21}/cm^3$.

In some embodiments, the barrier layer 610 between the first and second doped portions 1710, 1810 of the barrier layer 610 is intrinsic. In other embodiments, the barrier layer 610 between the first and second doped portions 1710, 1810 of the barrier layer 610 is doped. In such other embodiments, a doping concentration of the barrier layer 610 between the first and second doped portions 1710, 1810 of the barrier layer 610 is lower than the doping concentrations of the first and second doped portions 1710, 1810 of the barrier layer 610.

After block 160 where the shell 1010' is formed above the core channel region 410, the barrier layer 610, and the first drain portion 810, the method 1500 proceeds to block 1530 where a portion of the shell 1010' is doped with seventh dopants. Referring to the example of FIG. 19, in some embodiments of block 1530, a portion of the shell 1010' above the first doped portion 1710 of the barrier layer 610 is doped with seventh dopants having the same conductivity type as the fourth dopants of the first drain portion 810. As a result, a first doped portion 1910 is formed in the shell 1010 above the first doped portion 1710 of the barrier layer 610. In some embodiments, in which the semiconductor device is an n-type transistor, the seventh dopants are n-type dopants. For example, the n-type dopant is Si if the shell 1010 is made of InAs. In other embodiments, in which the semiconductor device is a p-type transistor, the seventh dopants are p-type dopants. For example, the p-type dopant is Zn if the shell 1010 is made of GaSb. It is noted herein that, during block 1530, the seventh dopants may diffuse into a portion of the shell 1010 above the core channel region 410.

In some embodiments, a doping concentration of the seventh dopants of the first doped portion 1910 of the shell 1010 is equal to or greater than a doping concentration of the fourth dopants of the first drain portion 810. For example, the doping concentration of the seventh dopants of the first doped portion 1910 of the shell 1010 is from about $5 \times 10^{12}/cm^3$ to about $1 \times 10^{21}/cm^3$. For example, the doping concentration of the fourth dopants of the first drain portion 810 is from about $5 \times 10^{18}/cm^3$ to about $1 \times 10^{21}/cm^3$.

After block 170 where the second drain portion 1110 of the drain region 1120 is formed, the method 1500 proceeds to block 1540 where a portion of the shell 1010 is doped with eighth dopants. Referring to the example of FIG. 20, in some embodiments of block 1540, a portion of the shell 1010 above the second doped portion 1810 of the barrier layer 610 is doped with eighth dopants having the same conductivity type as the fourth dopants of the first drain portion 810. As a result, a second doped portion 2010 is formed in the shell 1010 above the second doped portion 1810 of the barrier layer 610. In some embodiments, in which the semiconductor device is an n-type transistor, the eighth dopants are n-type dopants. For example, the n-type dopant is Si if the first shell 1010 is made of InAs. In other embodiments, in which the semiconductor device is a p-type transistor, the eighth dopants are p-type dopants. For example, the p-type dopant is Zn if the shell 1010 is made of GaSb. It is noted herein that, during block 1540, the eighth dopants may diffuse into the second drain portion 1110 of the drain region 1120.

In some embodiments, a doping concentration of the eighth dopants of the second doped portion 2010 of the shell 1010 is equal to or greater than a doping concentration of the fourth dopants of the first drain portion 810. For example, the doping concentration of the eighth dopants of the second doped portion 2010 of the shell 1010 is from about $5 \times 10^{18}/cm^3$ to about $1 \times 10^{21}/cm^3$.

In some embodiments, the shell 1010 between the first and second doped portions 1910, 2010 of the shell 1010 is intrinsic. In other embodiments, the shell 1010 between the first and second doped portions 1910, 2010 of the shell 1010 is doped. In such other embodiments, a doping concentration of the shell 1010 between the first and second doped portions 1910, 2010 of the shell 1010 is lower than the doping concentrations of the first and second doped portions 1910, 2010 of the shell 1010.

Figure 21:
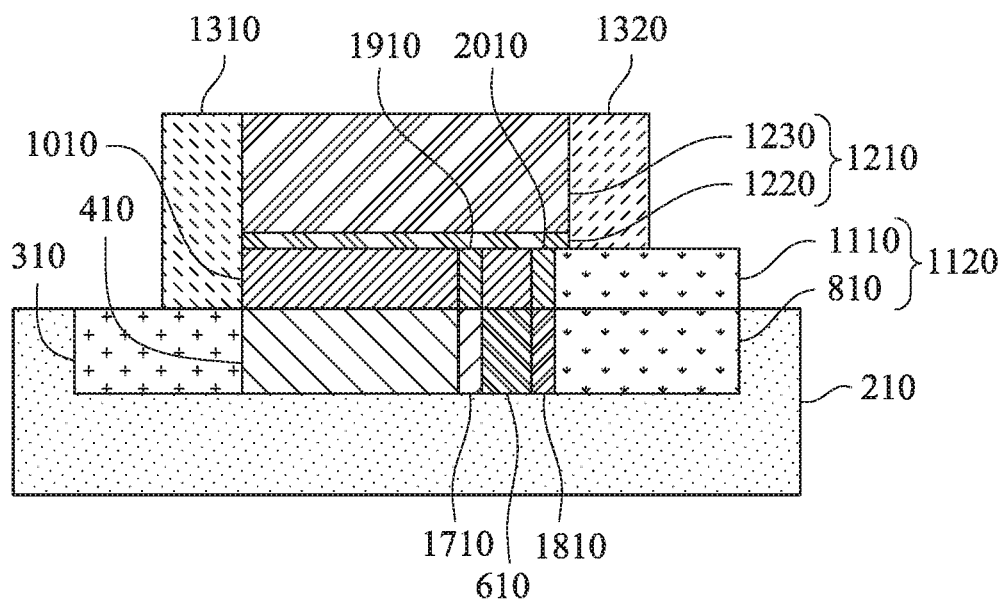

Referring to FIG. 21, illustrated therein is a semiconductor device that includes the graded doped barrier layer 610 and the graded doped shell 1010. The configurations of the graded doped barrier layer 610 and/or the graded doped shell 1010 suppress interfacial energy band barriers at the interfaces between the barrier layer 610 and the core channel region 410 and between the barrier layer 610 and the drain region 1120 of the semiconductor device.

Figure 22:
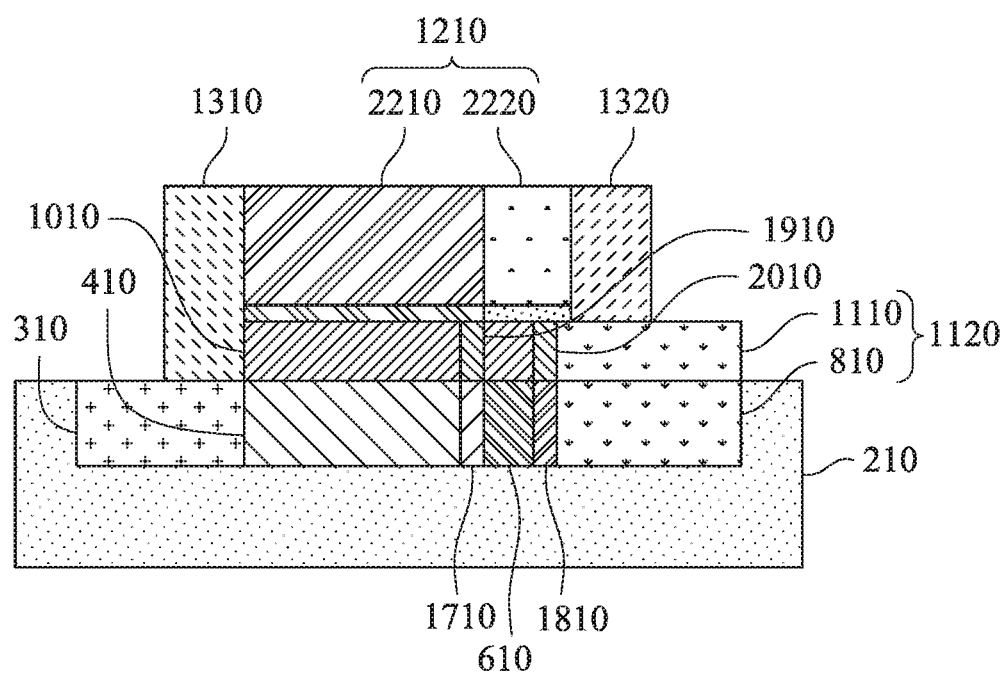
FIG. 22 is a cross-sectional view illustrating a semiconductor device in accordance with some embodiments of the present disclosure.

The gate stack unit 1210, in this exemplary embodiment, includes a single gate stack that has the gate dielectric layer 1220 and the gate electrode 1230. In some embodiments, as illustrated in FIG. 22, the gate stack unit 1210 includes a pair of gate stacks 2210, 2220. FIG. 22 is a cross-sectional view illustrating a dual gate stack semiconductor device in accordance with some embodiments of the present disclosure. In such some embodiments, the gate stack 2210 overlaps the core channel region 410 and the barrier layer 610. The gate stack 2220 overlaps the barrier layer 610 and the drain region 1120. In other embodiments, the gate stack unit 1210 may surround the core channel region 410, the barrier layer 610, and the drain region 1120.

Figure 23:
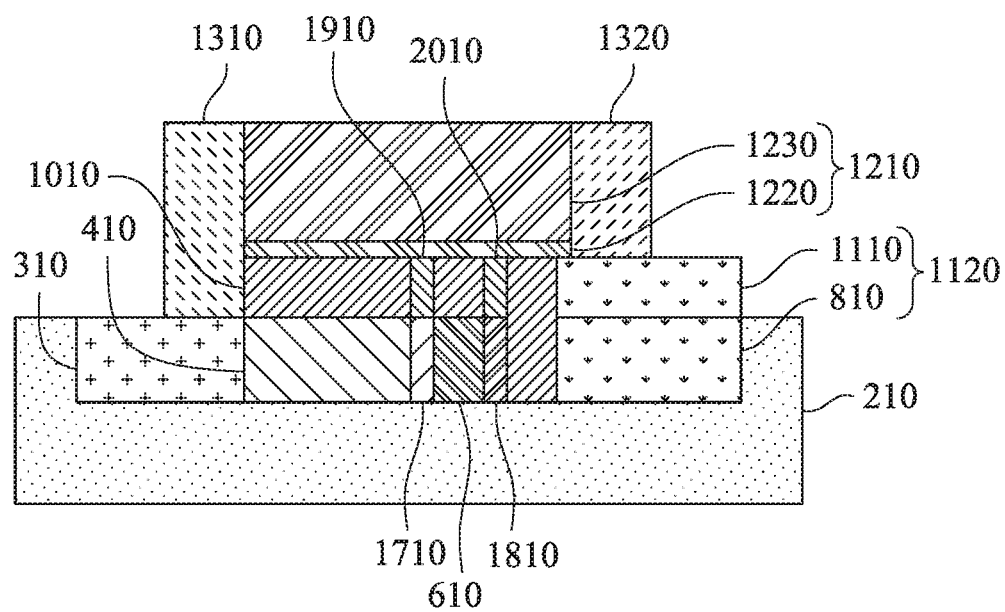
FIG. 23 is a cross-sectional view illustrating a semiconductor device in accordance with some embodiments of the present disclosure.

In some embodiments, the shell 1010 is an L shaped shell. FIG. 23 is a cross-sectional view of a semiconductor device in accordance with some embodiments. In such some embodiments, as illustrated in FIG. 23, one leg of the shell 1010 rests on the top surface of the core channel region 410 and the top surface of the barrier layer 610. The other leg of the shell 1010 stands on the substrate 210 and is interposed between the barrier layer 610 and the drain region 1120. It is noted herein that the sixth dopants of the second doped portion 1810 of the barrier layer 610 may diffuse into the shell 1010.

Figure 24:
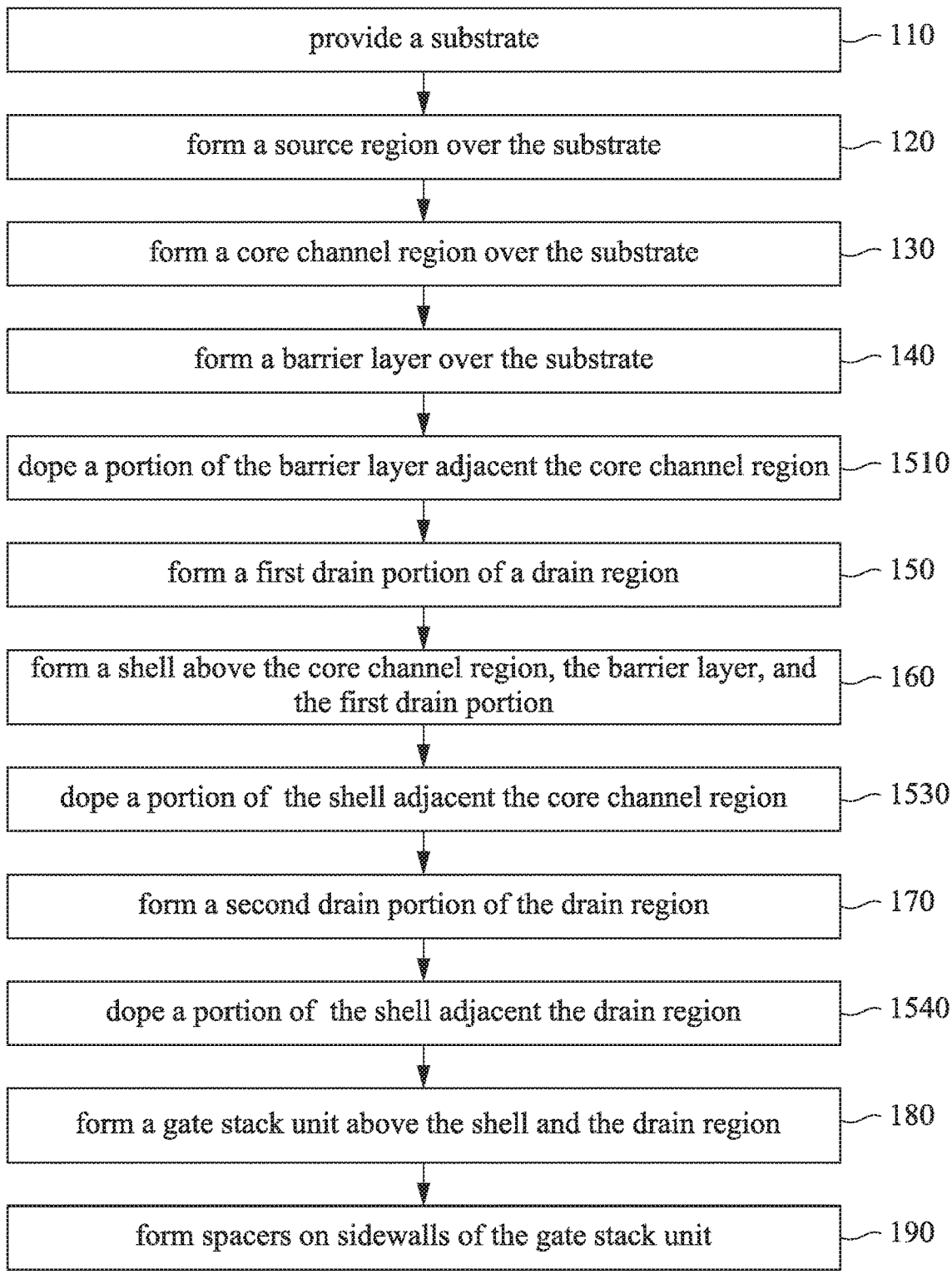
FIG. 24 is a flow chart of a method of manufacturing a semiconductor device in accordance with some embodiments of the present disclosure.
Figure 25:
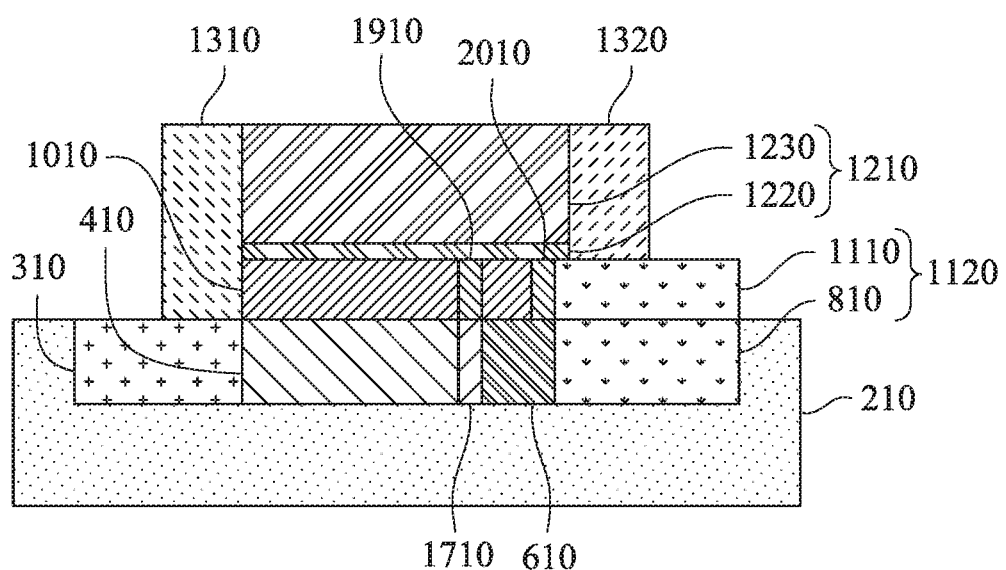
FIG. 25 is a cross-sectional view illustrating a semiconductor device in accordance with some embodiments of the present disclosure.

It is understood that additional operations may be implemented before, during, and after the method 1500, and some of the operations described may be replaced or eliminated for other embodiments of the method 1500. For example, illustrated in FIG. 24 is a flow chart of a method 2400 of manufacturing a semiconductor device in accordance with some embodiments of the present disclosure. FIG. 25 is a cross-sectional view illustrating a semiconductor device in accordance with some embodiments of the present disclosure.

Blocks 110-190, 1510, 1530, and 1540 of method 2400 are similar to those described above with respect to blocks 110-190 of method 100 and blocks 1510, 1530, and 1540 of method 1500, a detailed description thereof is dispensed herewith for the sake of brevity.

Method 2400 differs from method 1500 in that method 2400 does not include block 1520. As such, as illustrated in FIG. 25, the portion of barrier layer 610 adjacent the drain region 1120 is not doped, e.g., with the sixth dopants.

Figure 26:
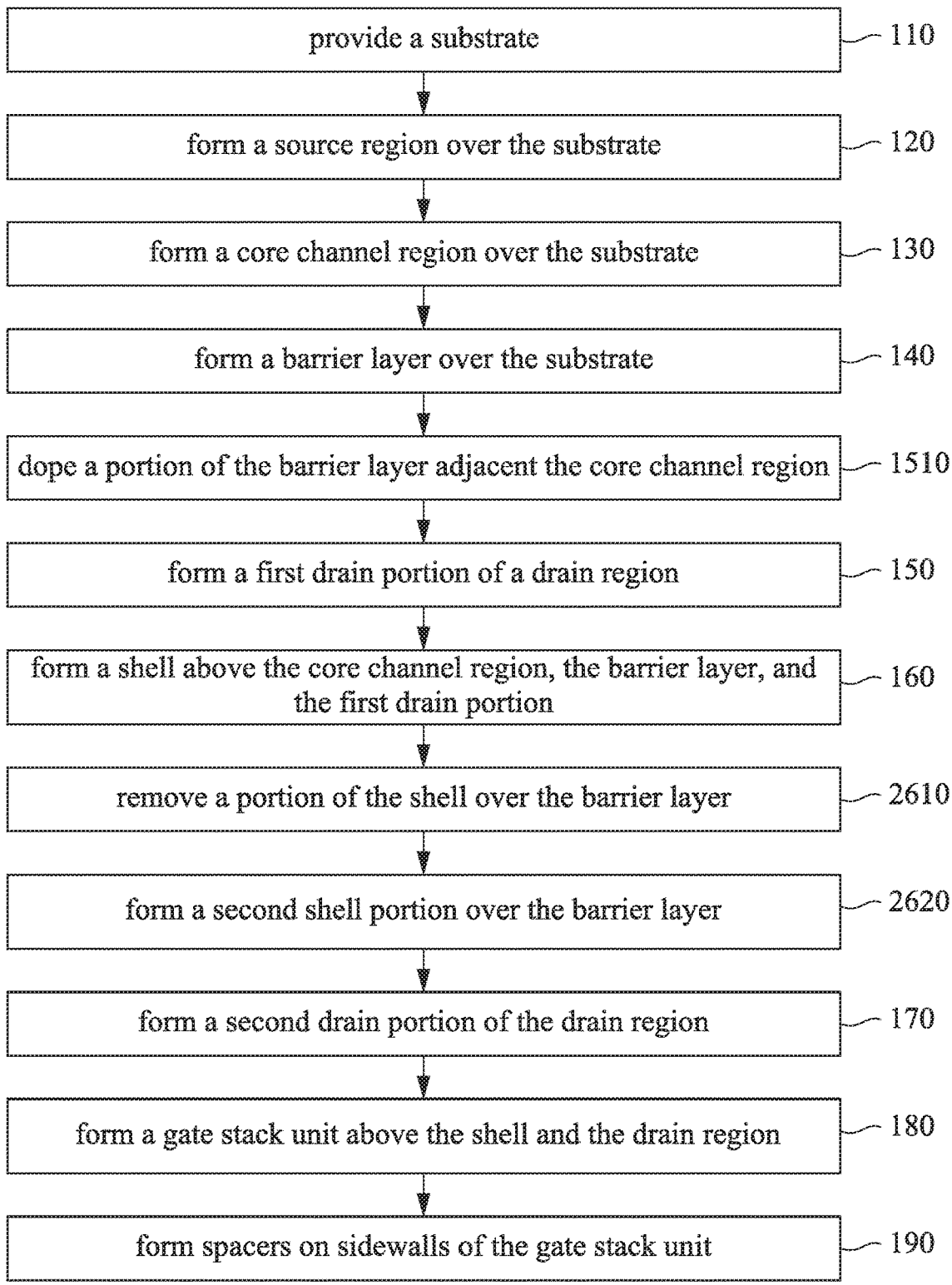
FIG. 26 is a flow chart of a method of manufacturing a semiconductor device in accordance with some embodiments of the present disclosure.
Figure 27:
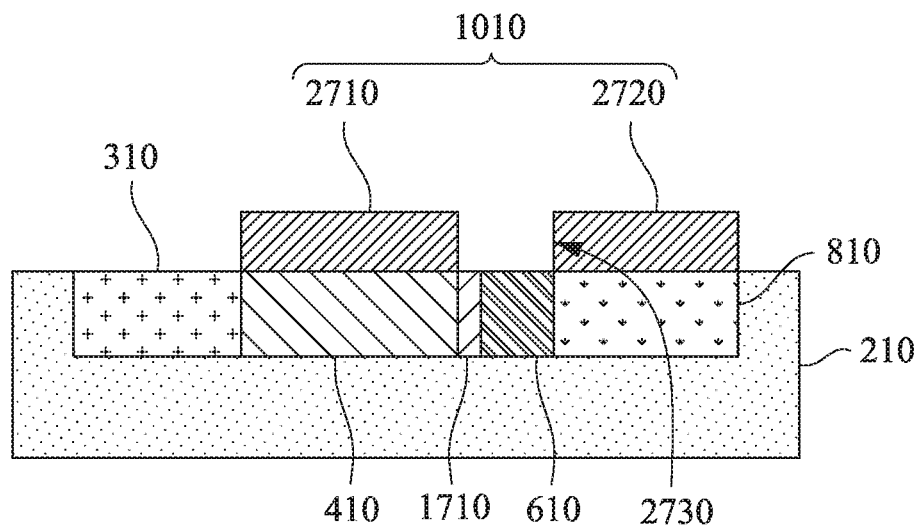
FIGS. 27 to 28 are cross-sectional view illustrating a semiconductor device at various stages of manufacturing in accordance with some embodiments of the present disclosure.
Figure 28:
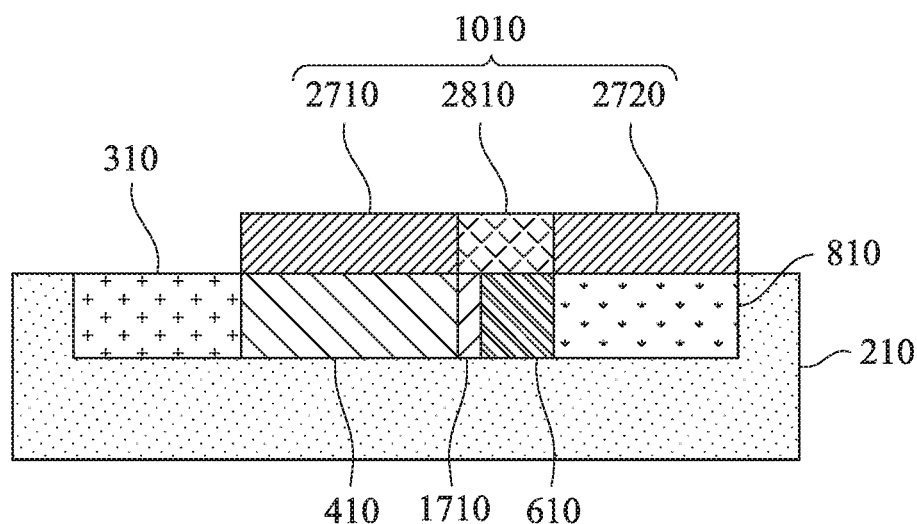
Figure 29:
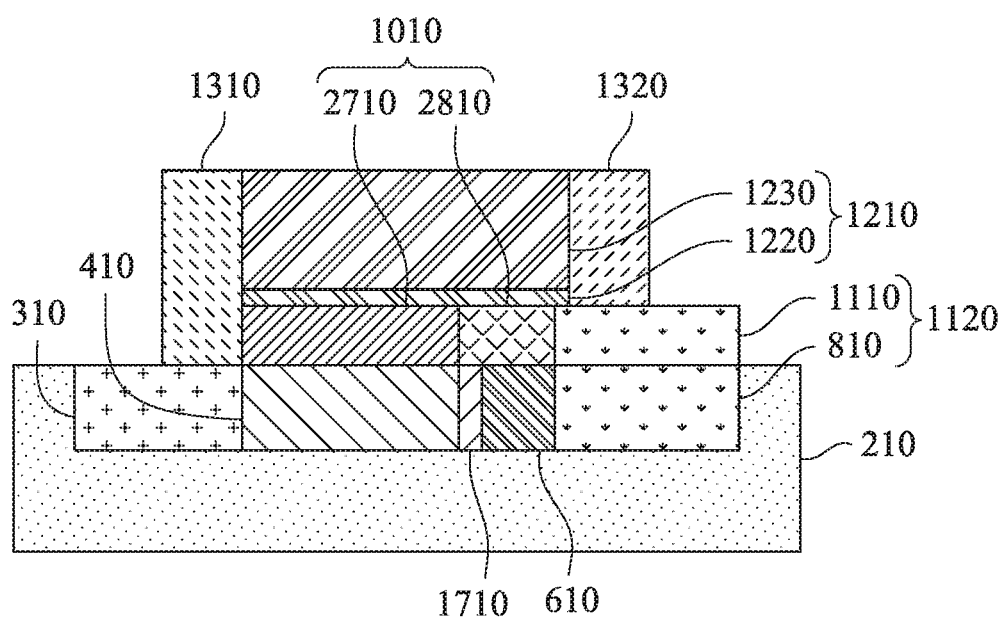
FIG. 29 is a cross-sectional view illustrating a semiconductor device in accordance with some embodiments of the present disclosure.
Figure 30:
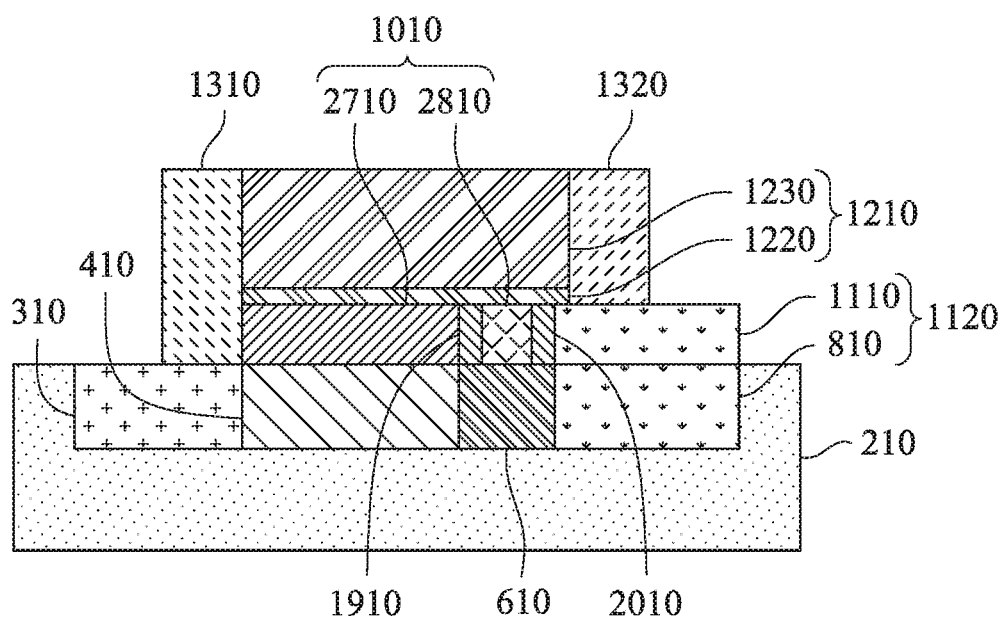
FIG. 30 is a cross-sectional view illustrating a semiconductor device in accordance with some embodiments of the present disclosure.

Illustrated in FIG. 26 is a flow chart of a method 2600 of manufacturing a semiconductor device in accordance with some embodiments of the present disclosure. FIGS. 27 and 28 are cross-sectional view illustrating a semiconductor device at various stages of manufacturing in accordance with some embodiments of the present disclosure. FIG. 29 is a cross-sectional view illustrating a semiconductor device in accordance with some embodiments of the present disclosure. FIG. 30 is a cross-sectional view illustrating a semiconductor device in accordance with some embodiments of the present disclosure.

Because blocks 110-190 and 1510 of method 2600 are similar to those described above with respect to blocks 110-190 of method 100 and block 1510 of method 1500, a detailed description thereof is dispensed herewith for the sake of brevity.

Method 2600 differs from method 1500 in that method 2600 does not include at least one of the blocks 1520, 1530, and 1540. For example, in some embodiments, method 2600 does not include blocks 1520, 1530, and 1540. As such, as illustrated in FIG. 29, the barrier layer 610 is not doped with the sixth dopants and the shell 1010 is not doped with the seventh and eighth dopants.

Moreover, method 2600 further includes blocks 2610 where the shell has a first shell portion and a second shell portion that includes a different material than the first shell portion. After block 160 where the shell 1010' is formed above the core channel region 410, the barrier layer 610, and the first drain portion 810, the method 2600 proceeds to block 2610 where the shell 1010' above the doped barrier layer 610 is removed. Referring to the example of FIG. 27, in some embodiments of block 2610, after the shell 1010' of FIG. 10 is formed, a portion of the shell 1010' above the barrier layer 610 is etched, e.g., by wet or dry etching, such that first and third shell portions 2710, 2720 of the shell 100 remain above the core channel region 410 and the first drain portion 810, respectively. A recess 2730 is formed between the first and third shell portions 2710, 2730 of the shell 1010.

Referring to the example of FIG. 28, in some embodiments of block 2610, a second shell portion 2810 is formed in the recess 2710 above the doped barrier layer 610 that includes a different material than the first and third shell portions 2710, 2720. In some embodiments, the second shell portion 2810 is epitaxially grown within the recess 2710. In such some embodiments, the second shell portion 2810 is grown using an epitaxial growth process such as MBE, MOCVD, and/or other suitable growth process.

The selection of a material for the first/third and second shell portions 2710, 2720, 2810 depend on whether the semiconductor device is implemented as a p-type or n-type device. For p-type devices, the second shell portion 2810 includes a material with a negative valence band offset versus the material of the first/third shell portion 2710, 2720. For examples, for p-type devices, the first/third shell portion 2710, 2720 includes GaSb, GaAsSb, Ge, SiGeSn, Si, or the like. The second shell portion 2810 includes AlGaSb, AlGaAsSb, SiGe, or the like. For n-type device, the second shell portion 2810 includes a material with positive conduction band offset versus the material of the first/third shell portion 2710, 2720. For examples, for n-type devices, the first/third shell portion 2710, 2720 includes, InAs, InGaAs, GeSn, Ge, or the like. The second shell portion 2810 includes, but not limited to, InGaAs, GaAs, or SiGeSn.

Thereafter, the gate stack unit 1210 and the spacers 1310, 1320 are formed, resulting in the semiconductor device of FIG. 29. As illustrated therein, the semiconductor device includes a first shell portion 2710 and a second shell portion 2810 that includes a different material than the first shell portion 2710. The construction as such facilitates alignment of the energy band of the shell 1010 over the core channel region 410 with the energy band of the shell 1010 over the barrier layer 610.

In other embodiments, method 2600 does not include blocks 1510 and 1520. As such, as illustrated in FIG. 30, the barrier layer 610 is not doped with the fifth and sixth dopants.

The present disclosure may also present some embodiments in the form of planar, vertical, horizontal, and fin-type transistors. The fin-type transistor is referred to herein as a Fin field-effect transistor (FinFET) device. Such a FinFET device may include a P-type FinFET device or an N-type FinFET device. The FinFET device may be a dual-gate device, a tri-gate device, a bulk device, a silicon-on-insulator (SOI) device, and/or a device with other configuration. Other embodiments of semiconductor devices may also benefit from aspects of the present disclosure. For example, some embodiments as described herein may also be applied to gate-all-around (GAA) devices, Omega-gate (Ω-gate) devices, or Pi-gate (π-gate) devices.

Figure 31:
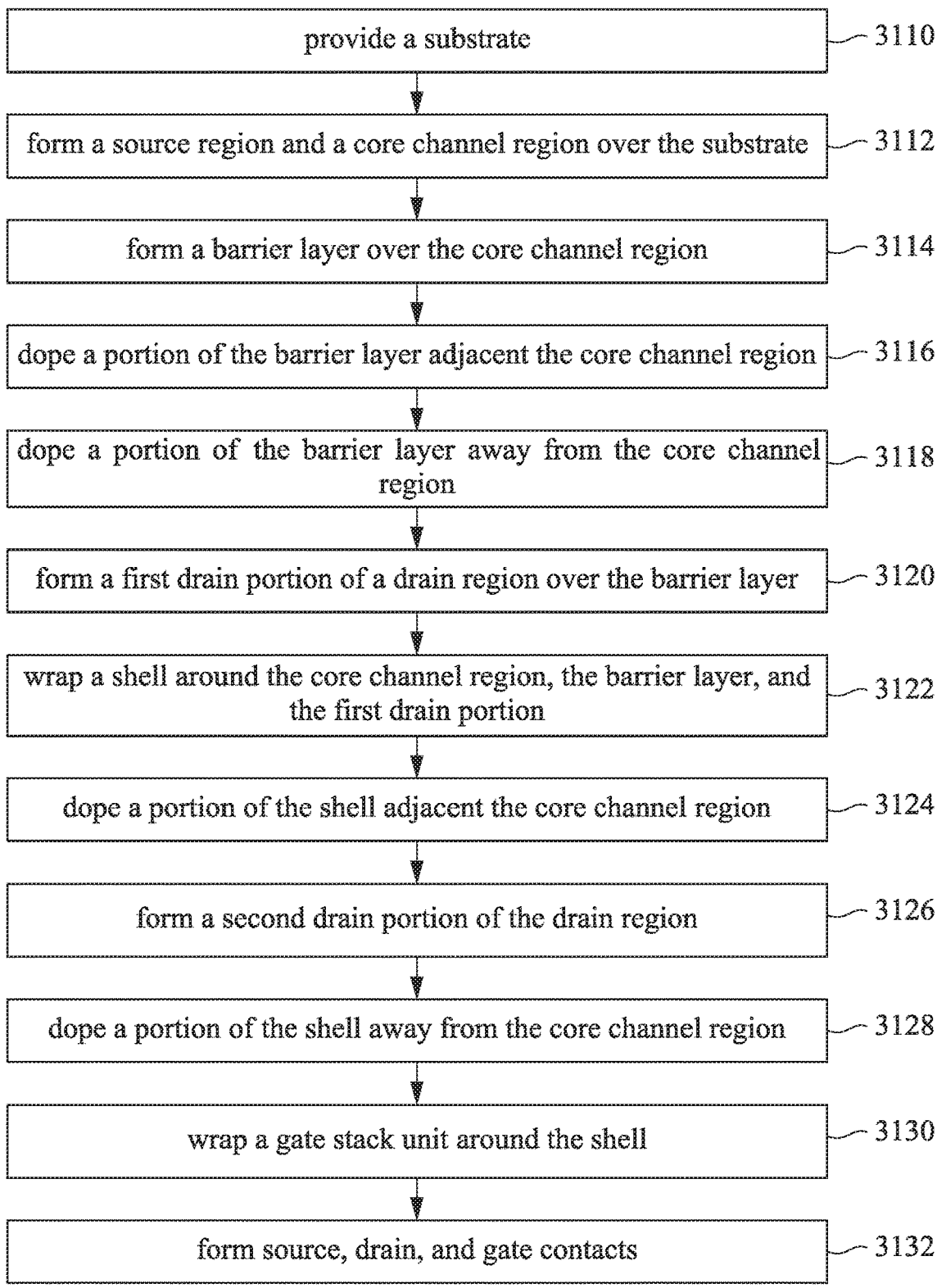
FIG. 31 is a flow chart of a method of manufacturing a semiconductor device in accordance with some embodiments of the present disclosure.
Figure 32:
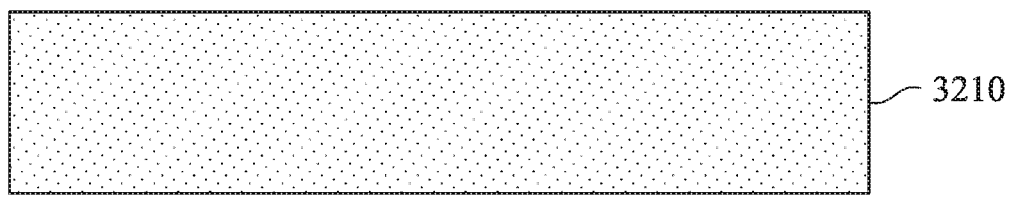
FIGS. 32 to 47 are cross-sectional view illustrating a semiconductor device at various stages of manufacturing in accordance with some embodiments of the present disclosure.

For example, illustrated in FIG. 31 is a flow chart of a method 3100 of manufacturing a semiconductor device in accordance with some embodiments of the present disclosure. Method 3100 is similar in many respects to those discussed above in association with methods 100, 1500, 2400, and 2600. FIGS. 32 to 47 are cross-sectional view illustrating a semiconductor device at various stages of manufacturing in accordance with some embodiments of the present disclosure. In some embodiments, the semiconductor device shown in FIGS. 32 to 47 may be intermediate devices fabricated during processing of an IC, or a portion thereof, that may include SRAM, logic circuits, passive components, such as resistors, capacitors, and inductors, and/or active components, such as PFETs, n-type FETs NFETs, multi-gate FETs, bipolar transistors, high voltage transistors, high frequency transistors, other memory cells, and combinations thereof. In some embodiments, the semiconductor device shown in FIGS. 32 to 47 has a vertical transistor structure.

The method 3100 begins at block 3110 where a substrate is provided. Referring to the example of FIG. 32, in some embodiments of block 3110, a substrate 3210 is provided. The substrate 3210 may be a semiconductor substrate such as a silicon substrate. The substrate 3210 may include various layers, including conductive or insulating layers formed on the substrate 3210. The substrate 3210 may include various doping configurations depending on design requirements as is known in the art. The substrate 3210 may also include other semiconductors such as germanium, SiC, SiGe, or diamond. Alternatively, the substrate 3210 may include a compound semiconductor and/or an alloy semiconductor. Further, in some embodiments, the substrate 3210 may include an epi-layer, the substrate 3210 may be strained for performance enhancement, the substrate 3210 may include a SOI structure, and/or the substrate 3210 may have other suitable enhancement features.

The method proceeds to block 3112 where a source region and a core channel region are formed over the substrate 3210. Referring to the example of FIG. 33, in some embodiments of block 3112, a source region 3310 and a core channel region 3320 are formed over the substrate 3210. In some embodiments, the source region 3310 and the core channel region 3320 may include the same material as the substrate 3210. In such some embodiment, the substrate 3210 may include a high-mobility material. The substrate 3210 is etched to form a core structure 3330, which protrudes out of the top surface of the substrate 3210. The core structure 3330 may be formed by lithography and etching processes. In some embodiments, a hard mask layer is deposited on the substrate 3210 first. The hard mask includes silicon oxide, silicon nitride, silicon oxynitride, or any other suitable dielectric material. The hard mask may be patterned by lithography and etching processes to define the core structure 3330. The substrate 3210 is etched by using the patterned hard mask as an etching mask to form the core structure 3330. The etch process may include wet etch, dry etch, or a combination thereof. In some embodiments, the core structure 3330 is formed as a cylinder shape, and a diameter of the core structure 3330 may be about 4 nm to about 30 nm. Alternatively, the core structure 3330 is formed as square-column, oval cylinder, rectangular column, hexagonal column, or other polygon-column shape.

Isolation features 3340 are formed in the substrate 3210 at opposite sides of the core structure 3330. The isolation features 3340 include different structures formed by using different processing technologies. In some embodiments, the isolation features 3340 are shallow trench isolation (STI) features. The formation of a STI may include etching a trench in the substrate 3210 and filling in the trench with insulator materials such as silicon oxide, silicon nitride, or silicon oxynitride. The filled trench may have a multi-layer structure such as a thermal oxide liner layer with silicon nitride filling the trench.

Subsequently, the source region 3310 is formed on the substrate 3210. The source region 3310 is formed by doping a top portion of the substrate 3210 with the second dopants by a suitable technique, such as implantation with a patterned photo resist as an implantation mask. After the implantation, one or more annealing processes may be performed for dopant activation. The annealing processes may include rapid thermal anneal (RTA), laser anneal, or other suitable annealing process. As an example, high-temperature anneal includes a "spike" annealing process that has a very short time duration. During the formation, the dopant is diffused up to a bottom portion of the core structure 3320.

Figure 33:
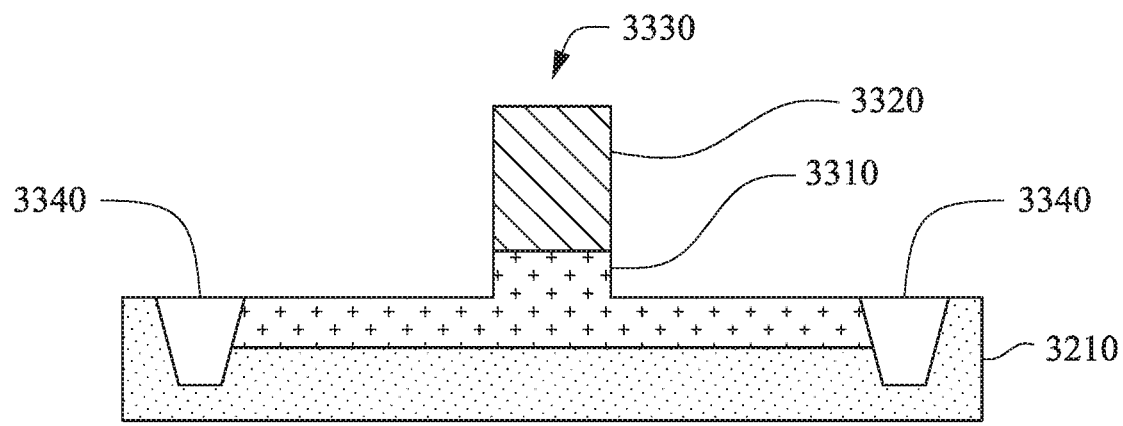

It is noted that although in FIG. 33, the source region 3310 and the core channel region 3320 are formed by patterning and doping the substrate 3210, in some embodiments, the source region 3310 and/or the core channel region 3320 can be epitaxial layers. In such some embodiments, a source material layer and a channel material layer are sequentially formed on the substrate 3210, and a lithography and etching process is performed on the source material layer and the channel material layer to form the source region 3310 and the core channel region 3320. In other embodiments, the substrate 3210 is doped to form the source region 3310, and a channel material layer is epitaxially formed on the source region 3310. The channel material layer is then patterned to form the core channel region 3320.

The core channel region 3320 is doped with the first dopants having the same conductivity type as the second dopants of the source region 3310. For example, for a p-type TFET, the core channel region 3320 may be doped with n-type dopants, such as phosphorus, arsenic, or combinations thereof. For an n-type TFET, the core channel region 3320 may be doped with p-type dopants, such as boron or $BF_2$. Further, the doping concentration of the core channel region 3320 may be higher than the doping concentration of the source region 3310. For example, the doping concentration of the second dopants of the source region 3310 may be from about $1 \times 10^{17}/cm^3$ to about $5 \times 10^{20}/cm^3$. For example, the doping concentration of the first dopants of the core channel region 3320 may be from about $5 \times 10^{18}/cm^3$ to about $1 \times 10^{21}/cm^3$. When the core channel region 3320 is epitaxially formed, the core channel region 3320 may be in-situ doped during the epitaxy process. In some embodiments, the core channel region 3320 is not in-situ doped. An implantation process (i.e., a junction implant process) is performed to dope the core channel region 3320.

The method 3100 proceeds to block 3114 where the barrier layer is formed over the core channel region 3320. Referring to the example of FIG. 34, in some embodiments of block 3114, a barrier layer 3410 is formed over the core channel region 3320. That is, the barrier layer 3410 is formed in contact with a top surface of the core channel region 3320. In various embodiments, the barrier layer 3410 is regrown using an epitaxial growth process such as MBE, MOCVD, and/or other suitable regrowth process. Examples of materials for the barrier layer 3410 include, but are not limited to, SiGe, strained Ge, Ge, GaAs, GaP, InP, InAs, InSb, GaAsP, InAlAs, AlGaAs, InGaAs, GaInP, and/or GaInAsP, or combinations thereof. In some embodiments, barrier layer 3410 is intrinsic. In other embodiments, the barrier layer 3410 is doped with the third dopants having the same conductivity type as the first dopants of the core channel region 3320. The barrier layer 3410 is similar in many respects to those discussed above in association with the barrier layer 610 in FIG. 6. In some other embodiments, a plurality of epitaxial layers may be formed on the substrate 3210 and then etched to be the source region 3310, the core channel region 3320, and the barrier layer 3410.

Figure 34:
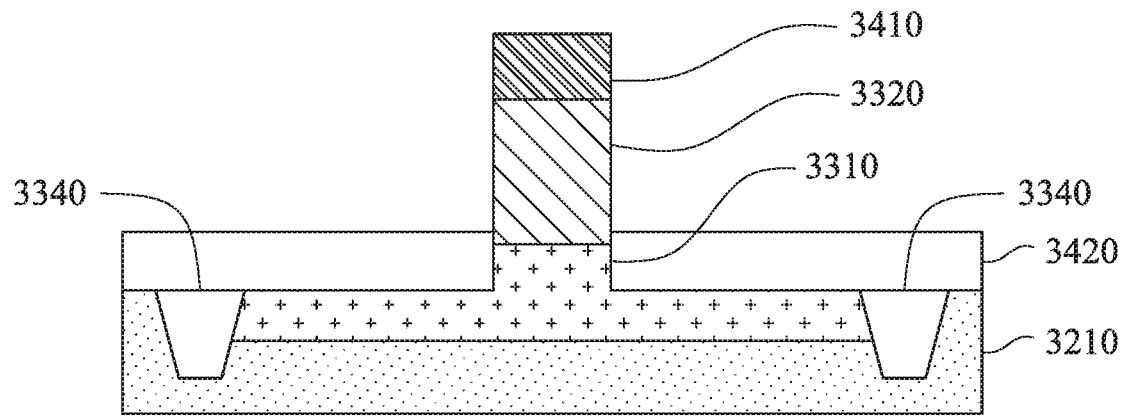
Figure 35:
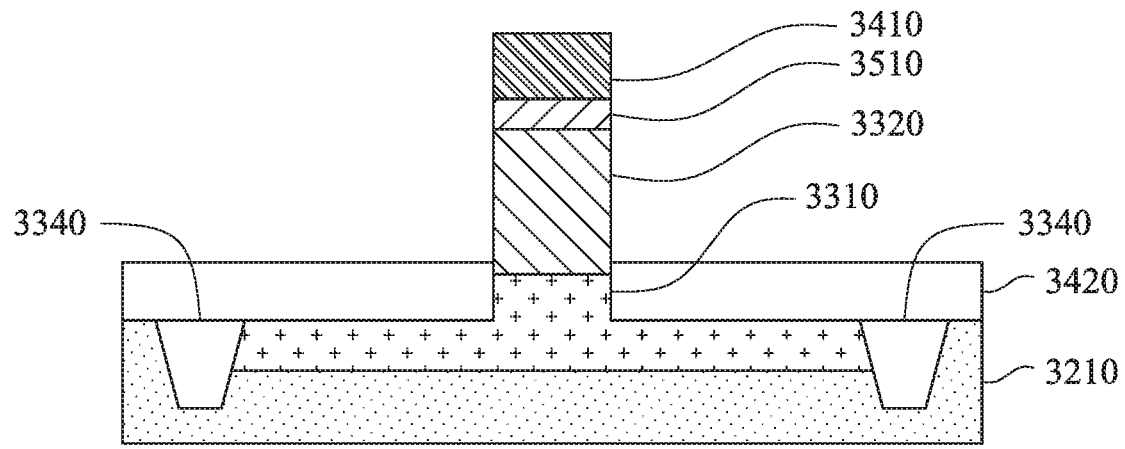
Figure 36:
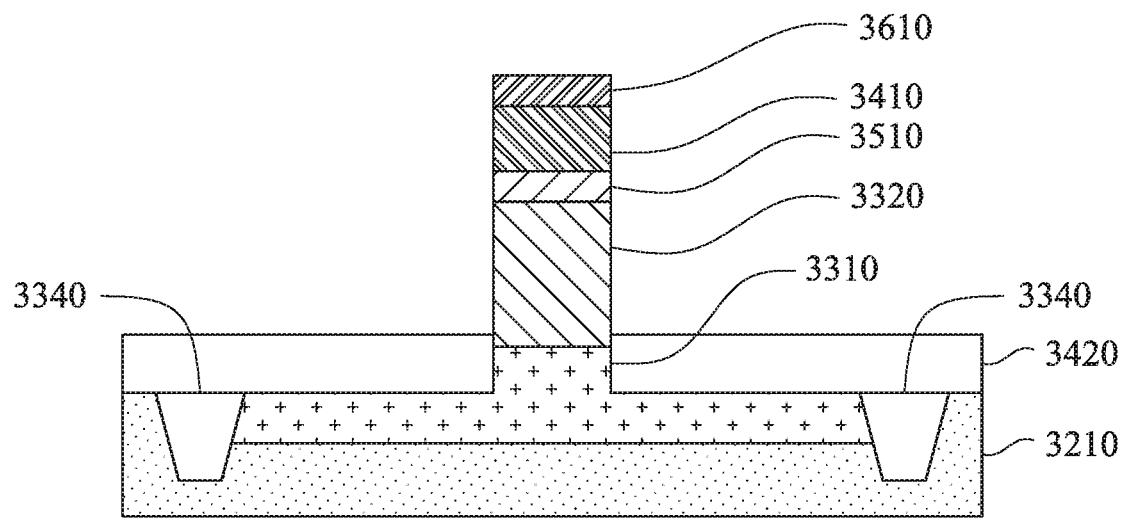
Figure 37:
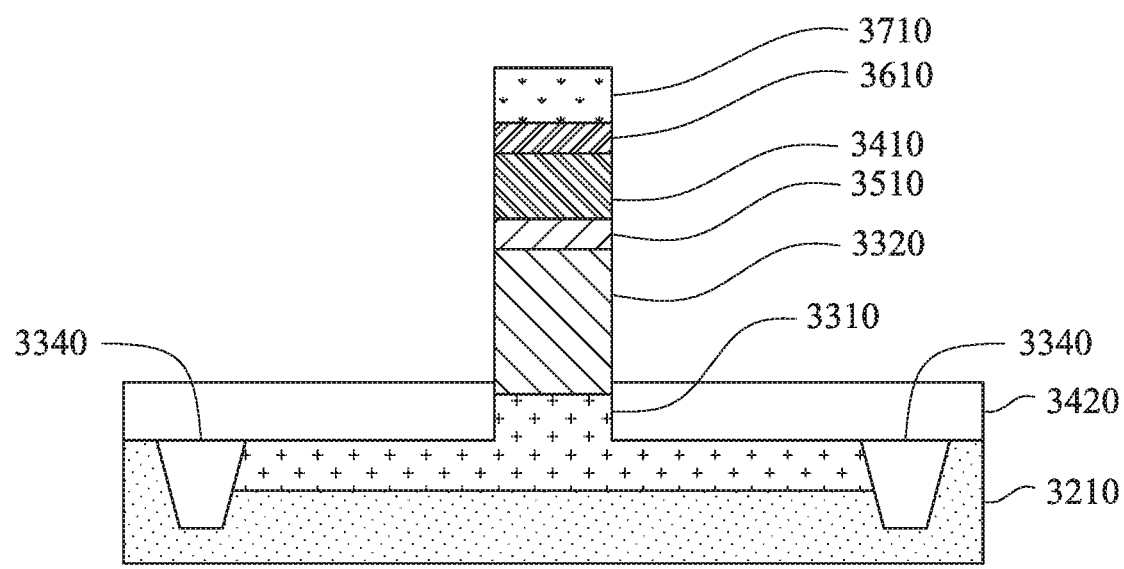
Figure 38:
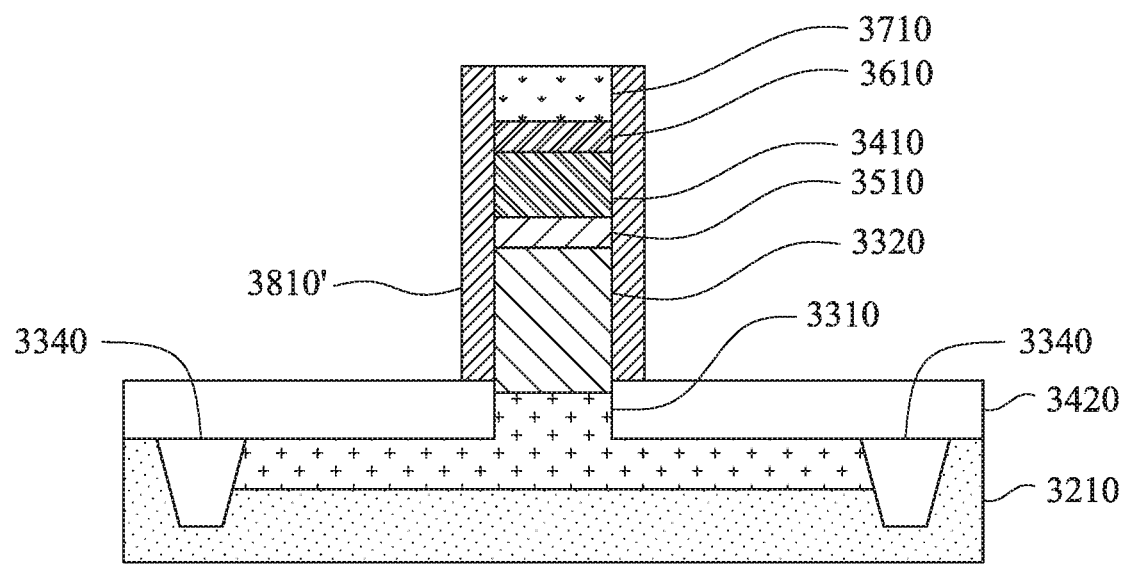
Figure 39:
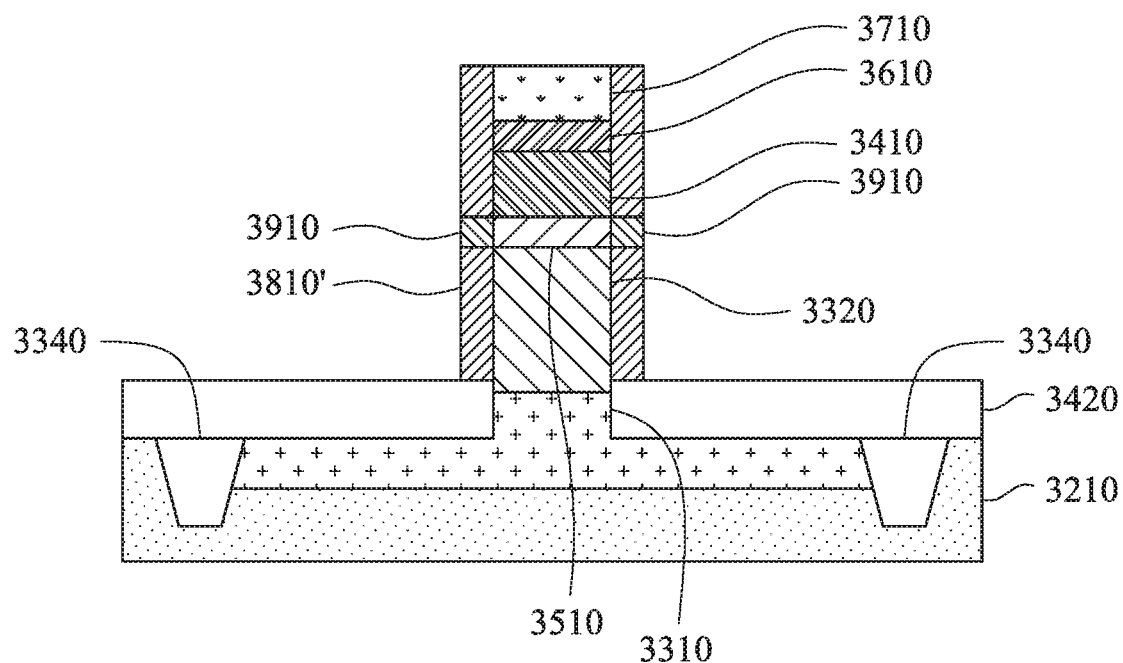
Figure 40:
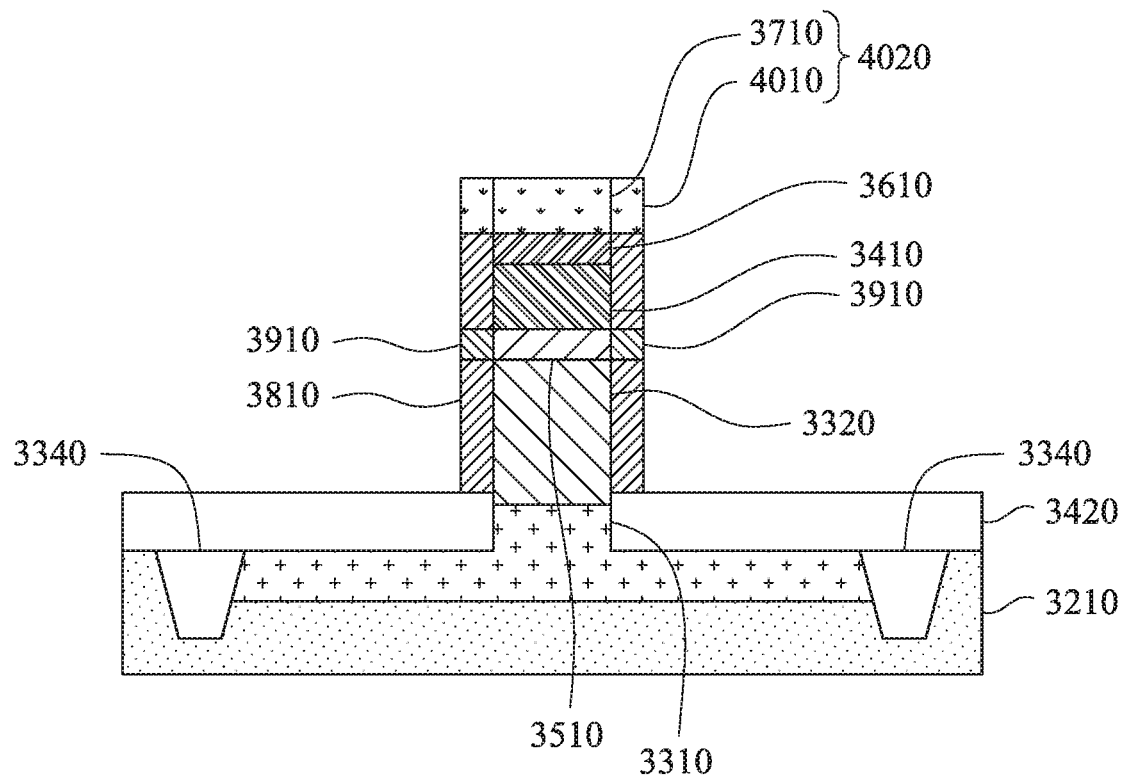
Figure 41:
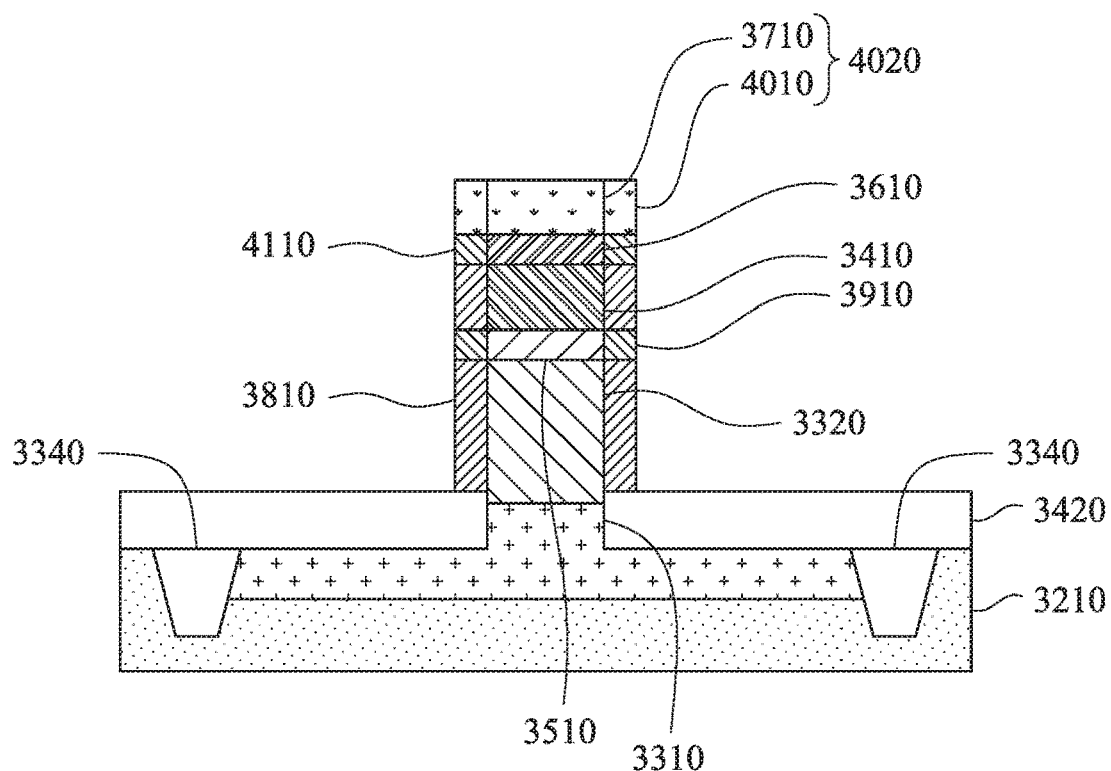
Figure 42:
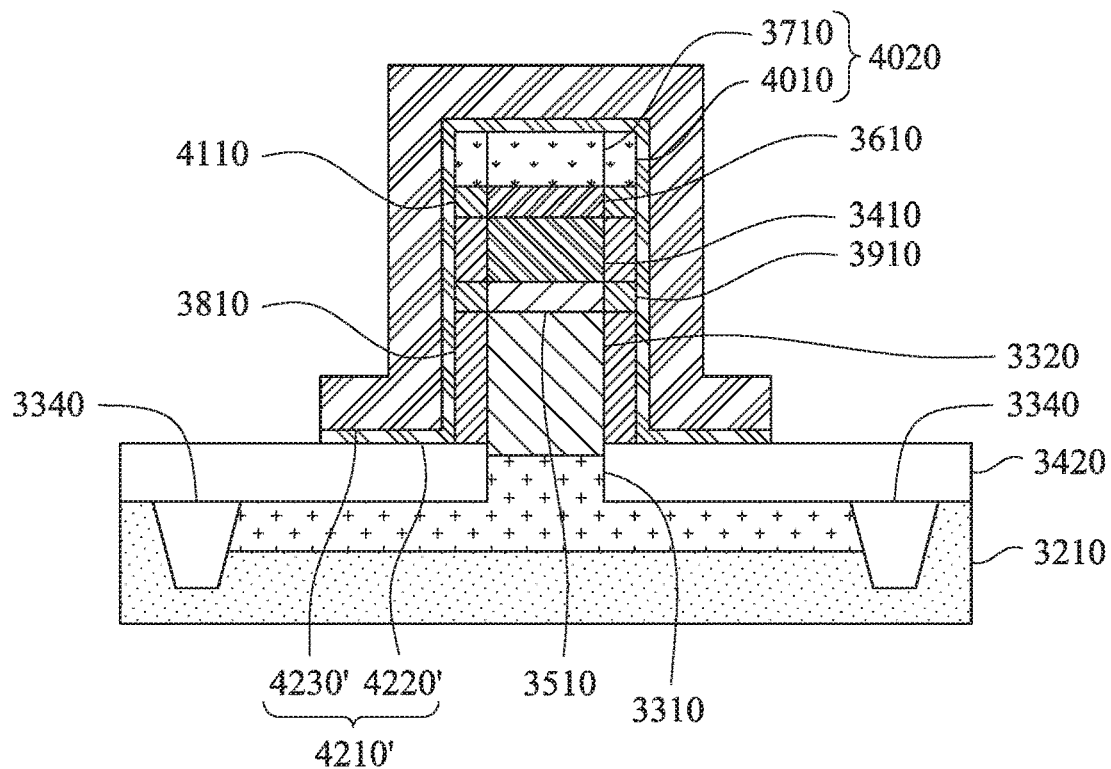

Then, a first spacer 3420 is formed on the substrate 3210. The first spacer 3420 is formed over the source region 3310 by deposition and recess processes. The first spacer 3420 includes low-k materials such as silicon oxide, silicon nitride, silicon carbide, oxynitride or other suitable materials. The first spacer 3420 includes a single layer or multiple layers. The first spacer 3420 is deposited by a suitable technique, such as CVD, ALD, PVD, thermal oxidation, or combinations thereof. In FIG. 34, the first spacer 3420 is etched back to wrap the source region 3310 and a portion of the core channel region 3320. The first spacer 3420 may be recessed by a selective dry etch, a selective wet etch, or combinations thereof.

The method 3100 proceeds to block 3116 where a portion of the barrier layer 3410 in contact with the core channel region 3320 is doped with the fifth dopants. Referring to the example of FIG. 35, in some embodiments of block 3116, after the barrier layer 3410 is formed, the first doped portion 3510 is formed in the barrier layer 3410 by doping the portion of the barrier layer 3410 in contact with the core channel region 3320 with fifth dopants having the same conductivity type as the first dopants of the core channel region 3320 by a suitable technique, such as implantation with a patterned photo resist as an implantation mask. The first doped portion 3510 of the barrier layer 3410 is similar in many respects to those discussed above in association with the first doped portion 1710 of the barrier layer 610 in FIG. 17.

The method 3100 proceeds to block 3118 where a portion of the barrier layer 3410 away from the core channel region 3320 is doped with sixth dopants. Referring to the example of FIG. 36, in some embodiments of block 3118, the second doped portion 3610 is formed in the barrier layer 3410 by doping the portion of the barrier layer 3410 away from the core channel region 3320 with sixth dopants having the conductivity type opposite to the first dopants of the core channel region 3320 by a suitable technique, such as implantation with a patterned photo resist as an implantation mask. The second doped portion 3610 of the barrier layer 3410 is similar in many respects to those discussed above in association with the second doped portion 1810 of the barrier layer 610 in FIG. 18.

In some embodiments, the barrier layer 3410 between the first and second doped portions 3510, 3610 of the barrier layer 3410 is intrinsic. In other embodiments, the barrier layer 3410 between the first and second doped portions 3510, 3610 of the barrier layer 3410 is doped. In such other embodiments, a doping concentration of the barrier layer 3410 between the first and second doped portions 3510, 3610 of the barrier layer 3410 is lower than the doping concentrations of the first and second doped portions 3510, 3610 of the barrier layer 3410.

The method 3100 proceeds to block 3120 where a first drain portion is formed over the barrier layer 3410. Referring to the example of FIG. 37, in some embodiments of block 3120, the first drain portion 3710 of the drain region (e.g., drain region 4020 of FIG. 40) is formed in contact with the doped barrier layer 3410. The first drain portion 3710 is doped with fourth dopants having a conductivity type same as the conductivity type of the sixth dopants of the second doped portion 3610 of the barrier layer 3410. In some embodiments, the first drain portion 3710 may be formed by one or more epitaxy or epitaxial (epi) processes. The epitaxial processes include CVD deposition techniques (e.g., vapor-phase epitaxy (VPE) and/or ultra-high vacuum CVD (UHV-CVD)), molecular beam epitaxy, and/or other suitable processes. The first drain portion 3710 may be in-situ doped during the epitaxy process. In some other embodiments, the first drain portion 3710 is not in-situ doped. An implantation process (i.e., a junction implant process) is performed to dope the first drain portion 3710.

The method 3100 proceeds to block 3122 where a shell is formed to wrap the barrier layer 3410, the core channel region 3320, and the first drain portion 3710. Referring to the example of FIG. 38, in some embodiments of block 3122, a shell 3810' is formed to wrap the doped barrier layer 3410, the core channel region 3320, and the first drain portion 3710. That is, the shell 3810' is in contact with side walls of the doped barrier layer 3410, the core channel region 3320, and the first drain portion 3710. The shell 3810' is similar its many respects to those discussed above in association with the shell 1010' in FIG. 10.

The method 3100 proceeds to block 3124 where a portion of the shell 3810' around the barrier layer 3410 adjacent the core channel region 3320 is doped. Referring to the example of FIG. 39, in some embodiments of block 3124, the first doped portion 3910 is formed by doping the portion of the shell 3810' surrounding the first doped portion 3510 of the barrier layer 3410 with the seventh dopants having the same conductivity type as the fourth dopants of the first drain portion 3710 by a suitable technique, such as implantation with a patterned photo resist as an implantation mask. The first doped portion 3910 is similar in many respects to those discussed above in association with the first doped portion 1910 in FIG. 19.

The method 3100 proceeds to block 3126 where a second drain portion of the drain region is formed. Referring to the example of FIG. 40, in some embodiments of block 3126, the shell 3810' surrounding the first drain portion 3710 is doped the same dopants as the first drain portion 3710, i.e., fourth dopants, to form a second drain portion 4010 such that a shell 3810 is formed around the core channel region 3320 and the doped barrier layer 3410. In some embodiments, the doping concentration of the fourth dopants in the shell 3810' is substantially the same as the doping concentration of the fourth dopants in the first drain portion 3710. The second drain portion 4010 and the first drain portion 3710 form a drain region 4020 of the semiconductor device. The second drain portion 4010 and the drain region 4020 are similar in many respects to those discussed above in association with the second drain portion 1110 and the drain region 1120 in FIG. 11, respectively.

The method 3100 proceeds to block 3128 where a portion of the shell 3810 around the barrier layer 3410 away from the core channel region 3320 is doped. Referring to the example of FIG. 41, in some embodiments of block 3128, the second doped portion 4110 is formed by doping the portion of the shell 3810 surrounding the second doped portion 3610 of the barrier layer 3410 with the eighth dopants having the same conductivity type as the fourth dopants of the first drain portion 3710 by a suitable technique, such as implantation with a patterned photo resist as an implantation mask. The second doped portion 4110 is similar in many respects to those discussed above in association with the second doped portion 2010 in FIG. 20.

In some embodiments, the shell 3810 between the first and second doped portions 3910, 4110 of the shell 3810 is intrinsic. In other embodiments, the shell 3810 between the first and second doped portions 3910, 4110 of the shell 3810 is doped. In such other embodiments, a doping concentration of the shell 3810 between the first and second doped portions 3910, 4110 of the shell 3810 is lower than the doping concentrations of the first and second doped portions 3910, 4110 of the shell 3810.

The formation of the second drain portions 4010 and the first and second doped portions 3910, 4110 may be in different sequences to those described above. For example, the first and second doped portions 3910, 4110 and the second drain portion 4010 are formed at the same time. The formation of the first doped portion 3910 is after the formation of at least one of the second drain region 4010 and the second doped portion 4110. The formation of the second drain portion 4010 is after the formation of the second doped portion 4110.

The selection of a material for each of the core channel region 3320, the barrier layer 3410, the source region 3310, the shell 3810, and the drain region 4020 depends on whether the semiconductor device is implemented as an n-type or p-type device. In some examples, for p-type devices, the barrier layer 3410 includes GaAs, AlSb, or InGaAs. The core channel region 3320 and the source region 3310 include InAs. The shell 3810 and the drain region 4020 include GaSb. In other examples, for p-type devices, the barrier layer 3410 includes InAlAs. The core channel region 3320 and the source region 3310 include InGaAs. The shell 3810 and the drain region 4020 include GaAsSb. In various examples, for p-type devices, the barrier layer 3410 includes GaAs, AlSb, or InGaAs. The core channel region 3320 and the source region 3310 include InAs. The shell 3810 and the drain region 4020 include InAs.

In some examples, for n-type devices, the barrier layer 3410 includes AlSb, InAlSb, GaAs or InGaAs. The core channel region 3320 and the source region 3310 include GaSb, GaAsSb or InGaSb. The shell 3810 and the drain region 4020 include InAs, InGaAs or InSb. In other examples, for n-type devices, the barrier layer 3410 includes Si or SiGe. The core channel region 3320 and the source region 3310 include Ge. The shell 3810 and the drain region 4020 include Si. In various examples, for n-type devices, the barrier layer 3410 includes Si, SiGe, or InP. The core channel region 3320 and the source region 3310 include Ge. The shell 3810 and the drain region 4020 include Si.

The method 3100 proceeds to block 3130 where a gate stack unit is formed to wrap around the shell 3810. Referring to the example of FIG. 42, in some embodiments of block 3130, a gate stack unit 4210' is formed to wrap around the shell 3810 and the drain region 4020. Specifically, the gate stack unit 4210' includes a planar portion, which is parallel to the surface of the substrate 3210 and over the first spacer 3420, and a gating surface, which wraps around the core channel region 3320, the doped barrier layer 3410, and the drain region 4020. The gate stack unit 4210' includes a gate dielectric layer 4220' and a gate electrode 4230'.

Figure 43:
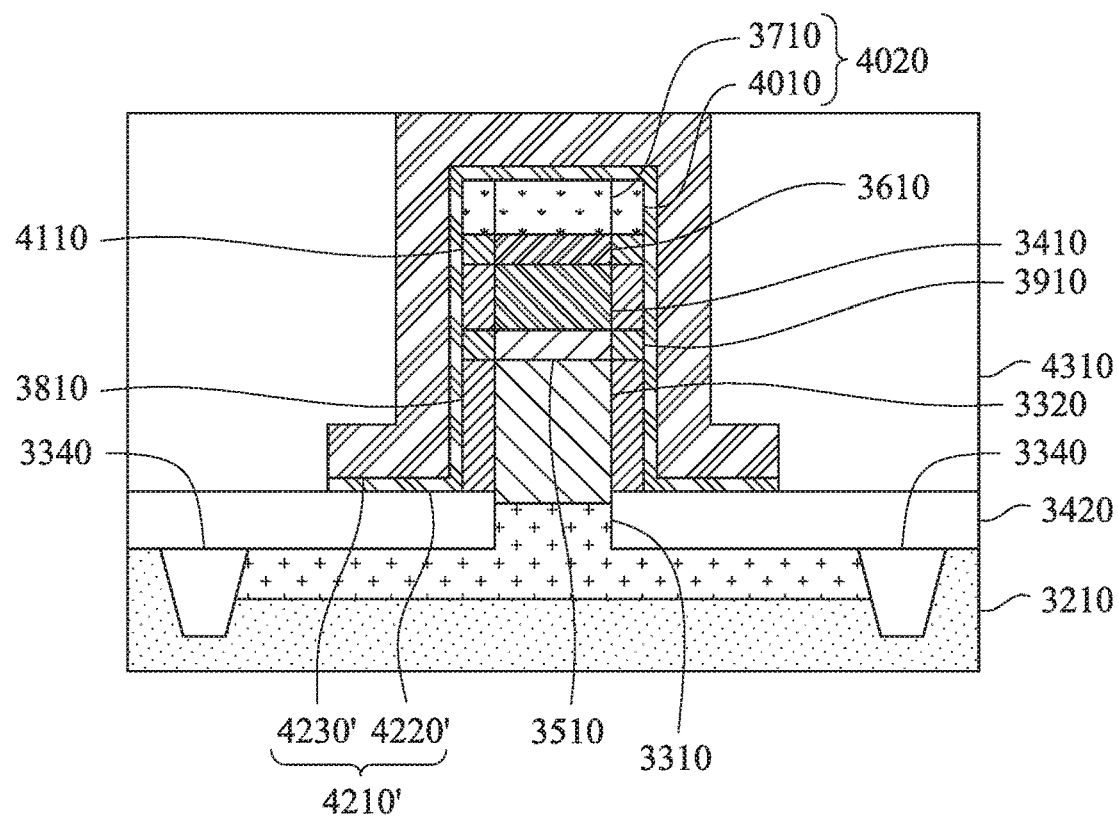

Referring to the example of FIG. 43, in some embodiments of block 3130, a first interlayer dielectric (ILD) 4310 is formed over the first spacer 3420 and around the gate stack unit 4210'. The first ILD 4310 is similar in many respects to those discussed above in association with the first spacer 3420 in FIG. 34.

Figure 44:
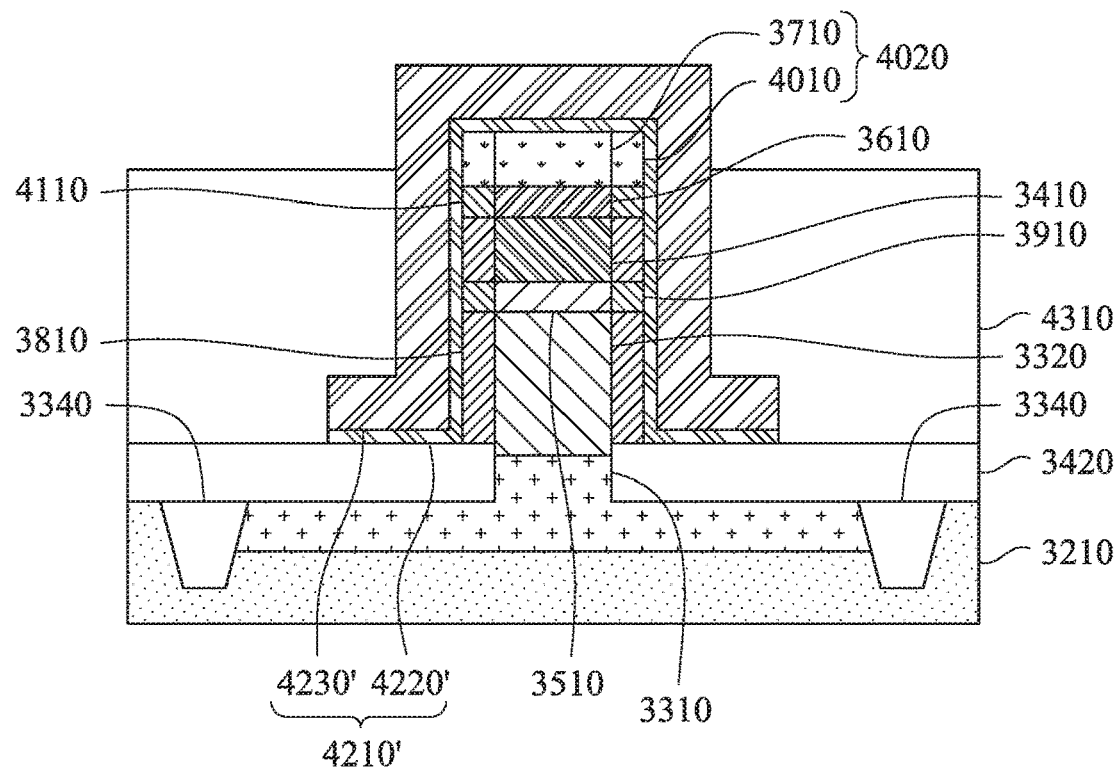

Referring to the example of FIG. 44, in some embodiments of block 3130, the first ILD 4310 is etched back to expose a predetermined height of a top portion of the gating surface of the gate stack unit 4210'.

Figure 45:
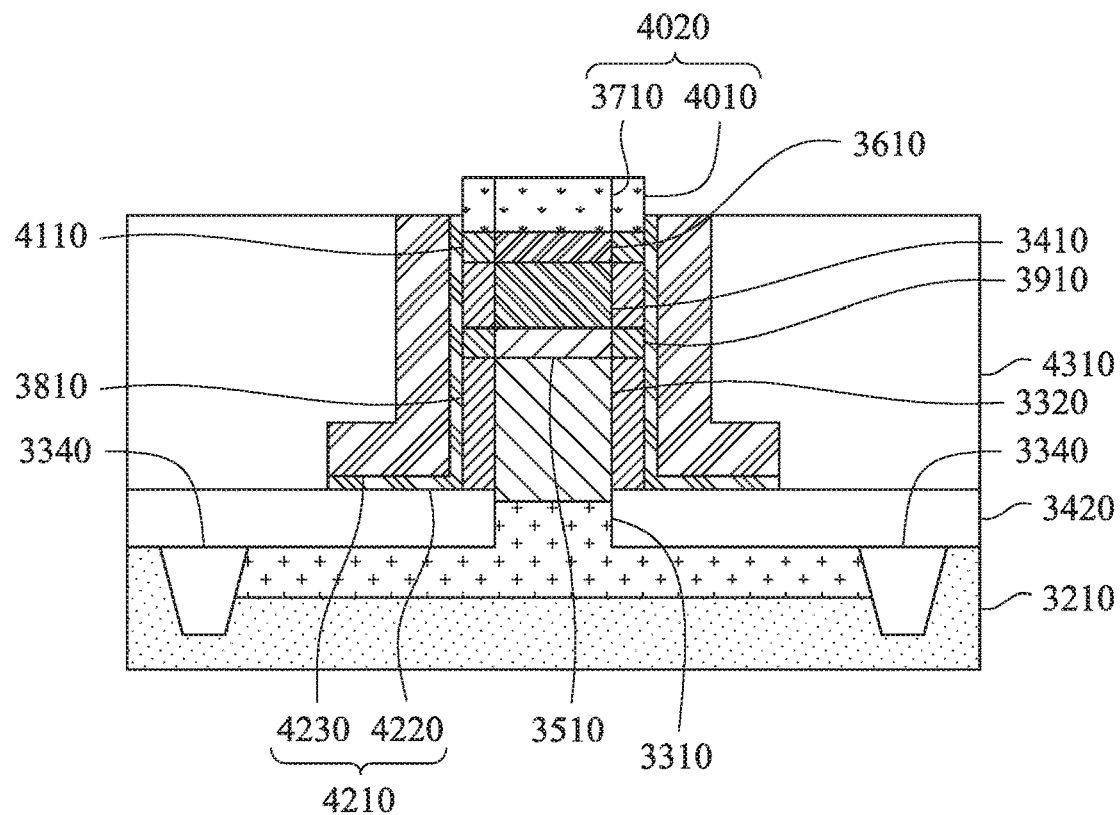

Referring to the example of FIG. 45, in some embodiments of block 3130, the gate stack unit 4210' of FIG. 44 is etched back to form the gate stack unit 4210, which exposes the drain region 4020. Specifically, the gating surface of the gate stack unit 4210' exposed by the first ILD 4310 is removed. Thus, the gate stack unit 4210 wraps around the core channel region 3320, the doped barrier layer 3410, and a portion of the drain region 4020. In some embodiments, the top portion of the gating surface of the gate stack unit 4210' may be removed by a selective dry etch, a selective wet etch, a combination thereof, or other suitable processes. The gate stack unit 4210, in this exemplary embodiment, includes a single gate stack that has a gate dielectric layer 4220 and a gate electrode 4230. The gate dielectric layer 4220 and the gate electrode 4230 are similar in many respects to those discussed above in association with the gate dielectric layer 1220 and the gate electrode 1230 in FIG. 12, respectively. In some embodiments, a length of the gate stack unit 4210 that wraps around the drain region 4020 is equal to or greater than about 2 nm. In other embodiments, the length of the gate stack unit 4210 that wraps around the drain region 4020 is equal to or less than about 7 nm. In certain embodiments, the length of the gate stack unit 4210 that wraps around the drain region 4020 ranges from about 3 nm to about 6 nm.

Figure 46:
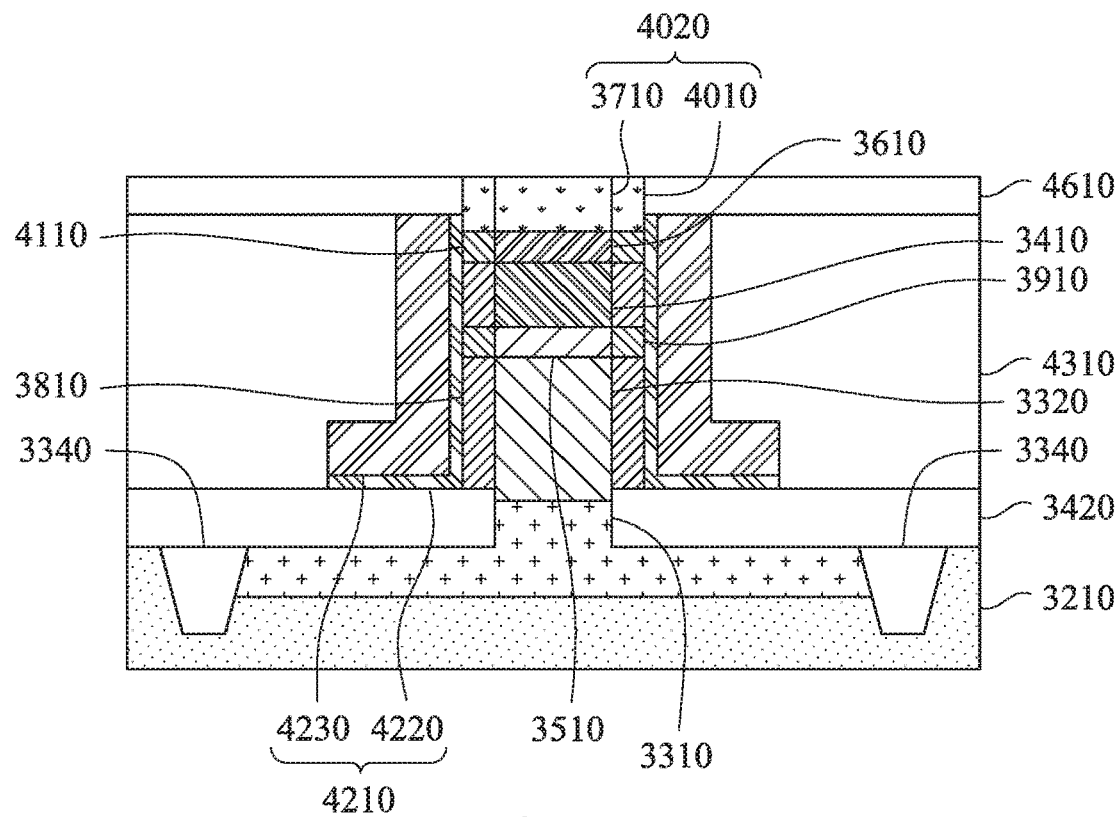

Referring to the example of FIG. 46, in some embodiments of block 3130, a second spacer 4610 is formed on the first ILD 4310 and wraps around the drain region 4020. The second spacer 4610 is deposited over the first ILD 4310. The second spacer 4610 is similar in many respects to those discussed above in association with the first spacer 3420 in FIG. 34. Additionally, a CMP process is performed to planarize the top surface of the second spacer 4610.

The method 3100 proceeds to block 3132 where contacts are formed to respectively contact the source region 3310, the gate stack unit 4210, and the drain region 4020. Referring to the example of FIG. 47, in some embodiments of block 3132, a second ILD 4710 is formed on the second spacer 4610 and the drain region 4020. The second ILD 4710 is similar in many respects to those discussed above in association with the first spacer 3420 in FIG. 34.

Then, contacts 4720, 4730, and 4740 are formed in the second ILD 4710 to be respectively in contact with the source region 3310, the gate stack unit 4210, and the drain region 4020. In some embodiments, the second ILD 4710 is etched to form a plurality of openings by various methods, including a dry etch, a wet etch, or a combination of dry etch and wet etch. Filling materials are formed in the openings. In some embodiments, metal materials can be filled in the openings, and excessive portions of the metal materials are removed by performing a CMP process to form the contacts 4720, 4730, and 4740. The filling materials can be made of tungsten, aluminum, copper, or other suitable materials.

Figure 48:
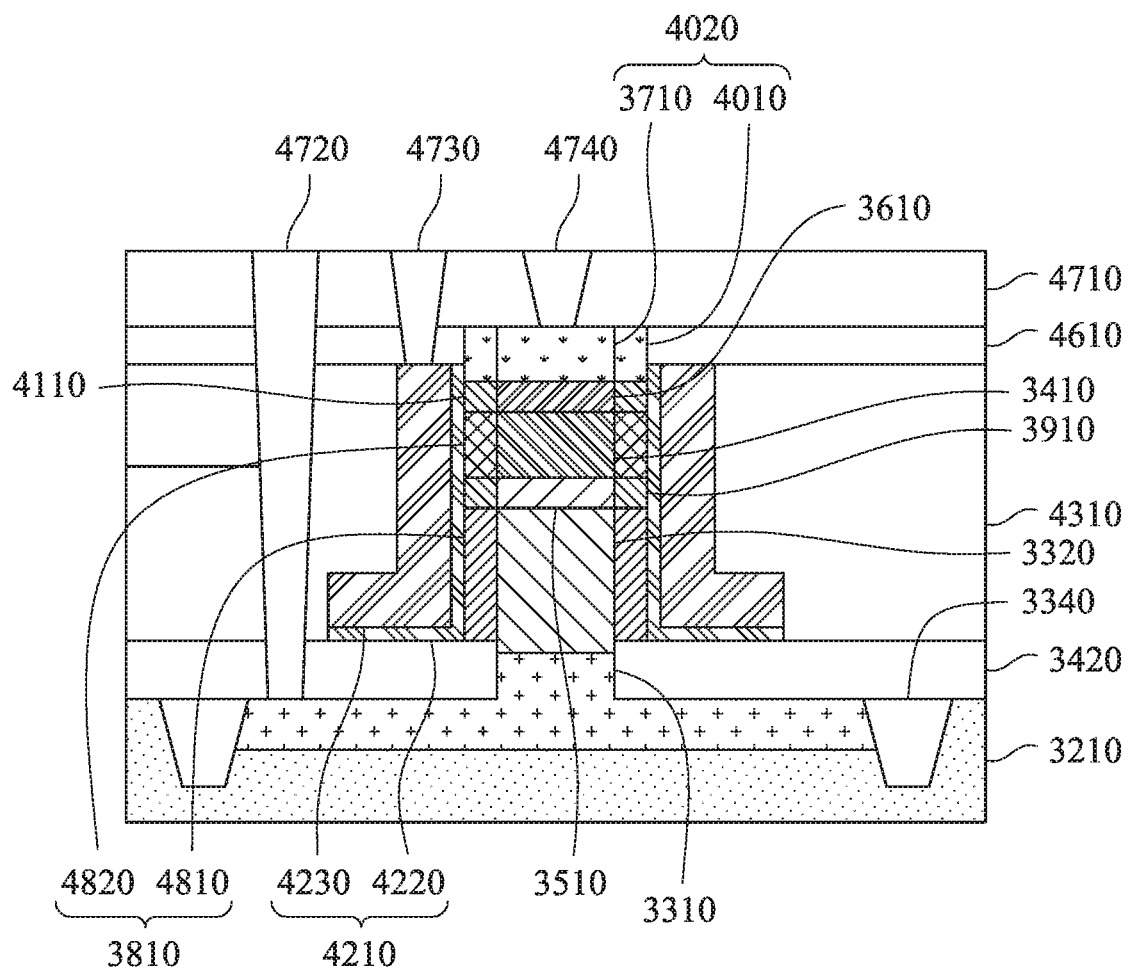
FIG. 48 is a cross-sectional view illustrating a semiconductor device in accordance with some embodiments of the present disclosure.

In some embodiments, as illustrated in FIG. 48, the shell 3810 includes first and second shell portion. FIG. 48 is a cross-sectional view illustrating a dual shell semiconductor device in accordance with some embodiments of the present disclosure. In such other embodiments, the first shell portion 4810 wraps around the core channel region 3320. The second shell 4820 wraps around the doped barrier layer 3410. The first and second doped portions 3910, 4110 are formed in the second shell portion 4820 surrounding the first and second doped portions 3510, 3610 of the harrier layer 3410, respectively. The first and second shell portions 4810, 4820 are similar in many respects to those discussed above in association with the first and second shell portions 2710, 2810 in FIG. 28, respectively.

Figure 49:
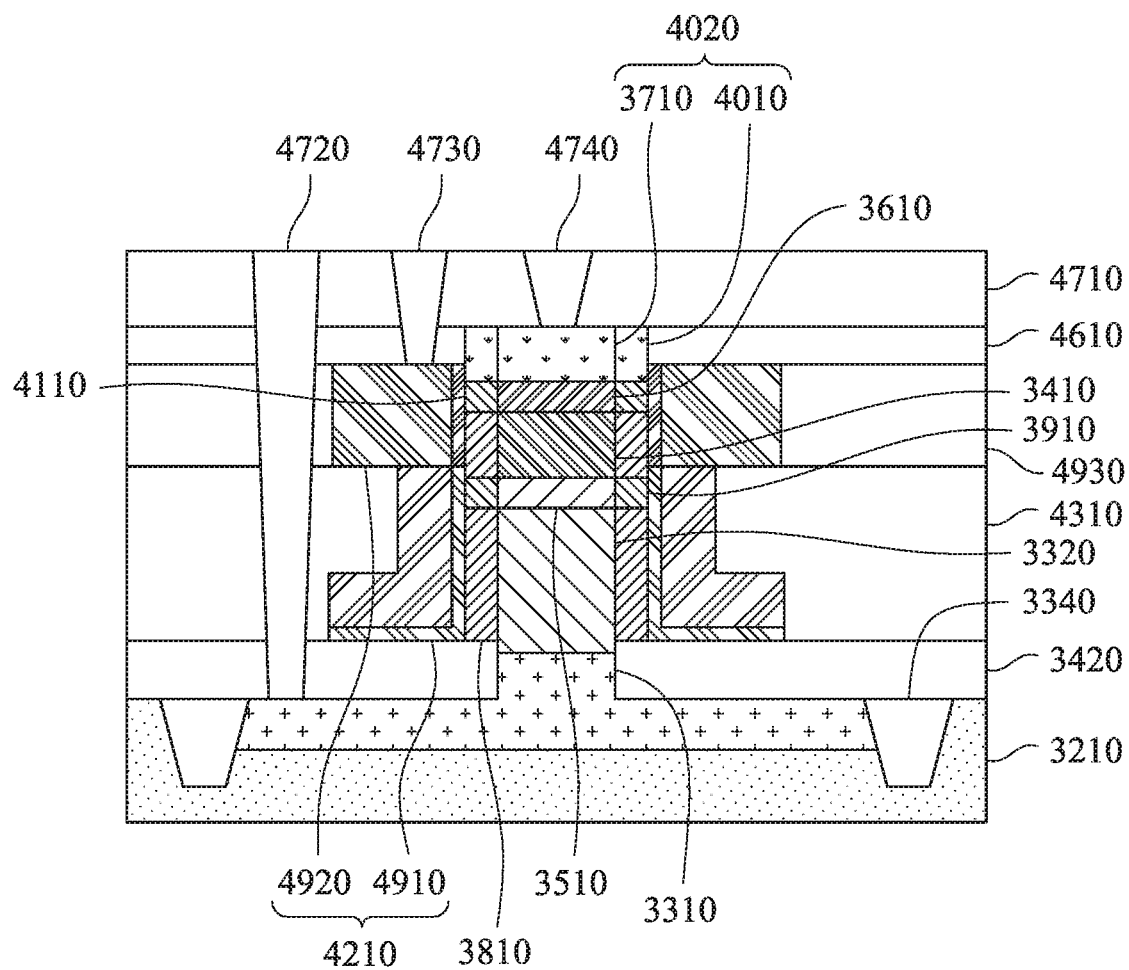
FIG. 49 is a cross-sectional view illustrating a semiconductor device in accordance with some embodiments of the present disclosure.

In other embodiments, as illustrated in FIG. 49, the gate stack unit 4210 includes a pair of gate stacks 4910 and 4920. In such other embodiments, the gate stack 4910 wraps around the core channel region 3320 and the barrier layer 3410. The gate stack 4920 wraps around the barrier layer 3410 and the drain region 4020. A third ILD 4930 is formed to wrap around the gate stack 4920. The third ILD 4930 is similar in many respects to those discussed above in association with the first ILD 4310.

The semiconductor device may undergo further processing to form various features and regions known in the art. For example, subsequent processing may form various vias/ lines and multilayers interconnect features (e.g., metal layers and interlayer dielectrics) on the substrate 3210, configured to connect the various features to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 50:
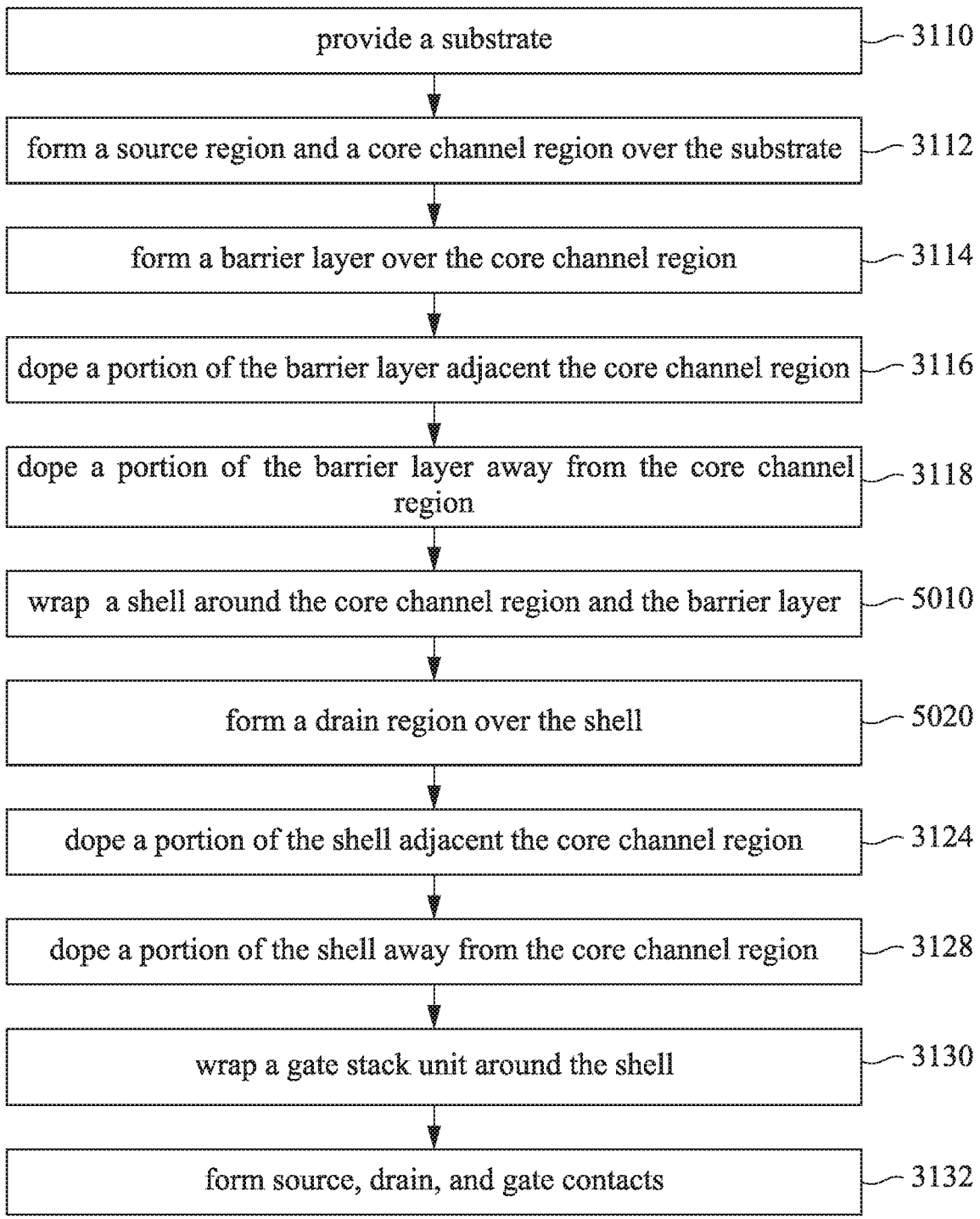
FIG. 50 is a flow chart of a method of manufacturing a semiconductor device in accordance with some embodiments of the present disclosure.
Figure 51:
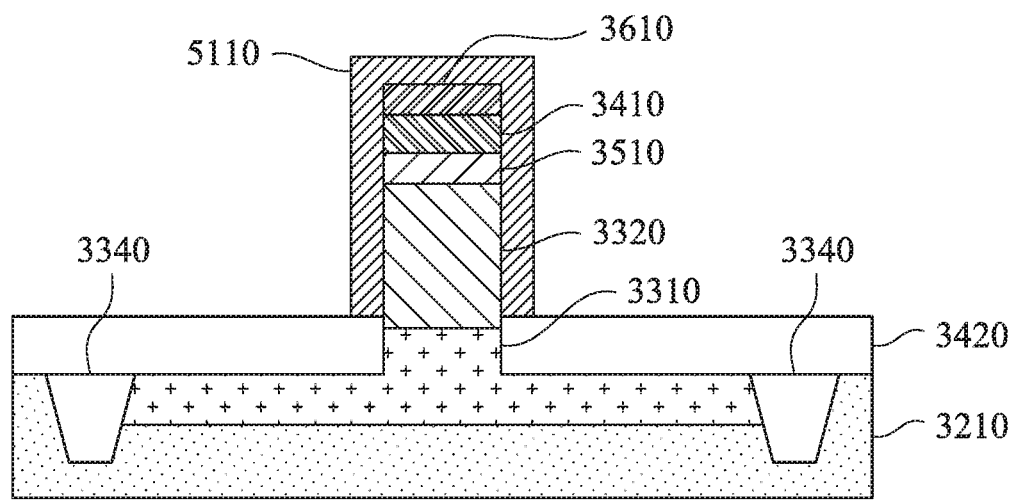
FIGS. 51 to 53 are cross-sectional views illustrating a semiconductor device at various stages of manufacturing in accordance with some embodiments of the present disclosure.
Figure 52:
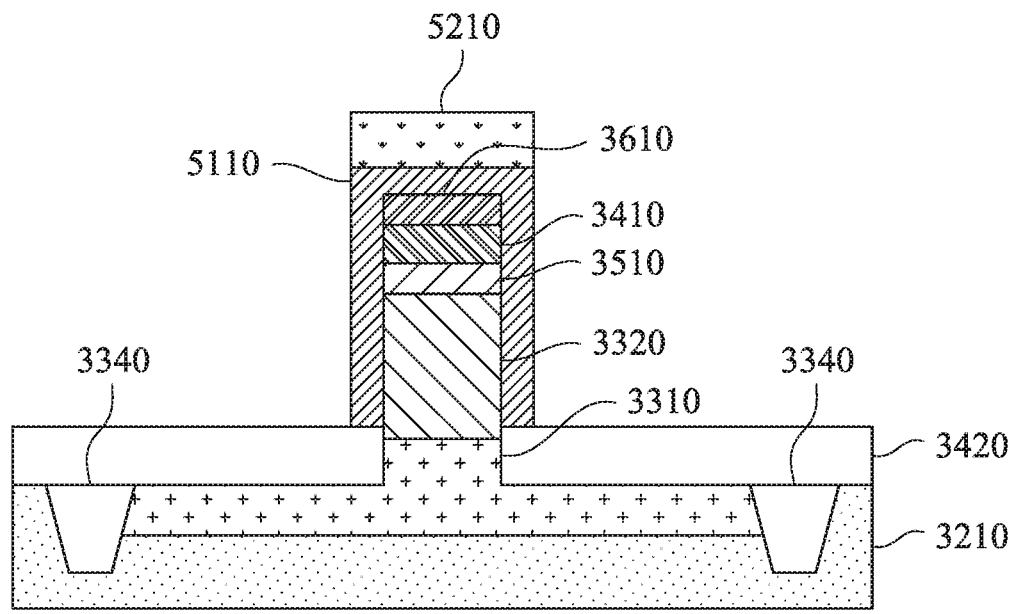
Figure 53:
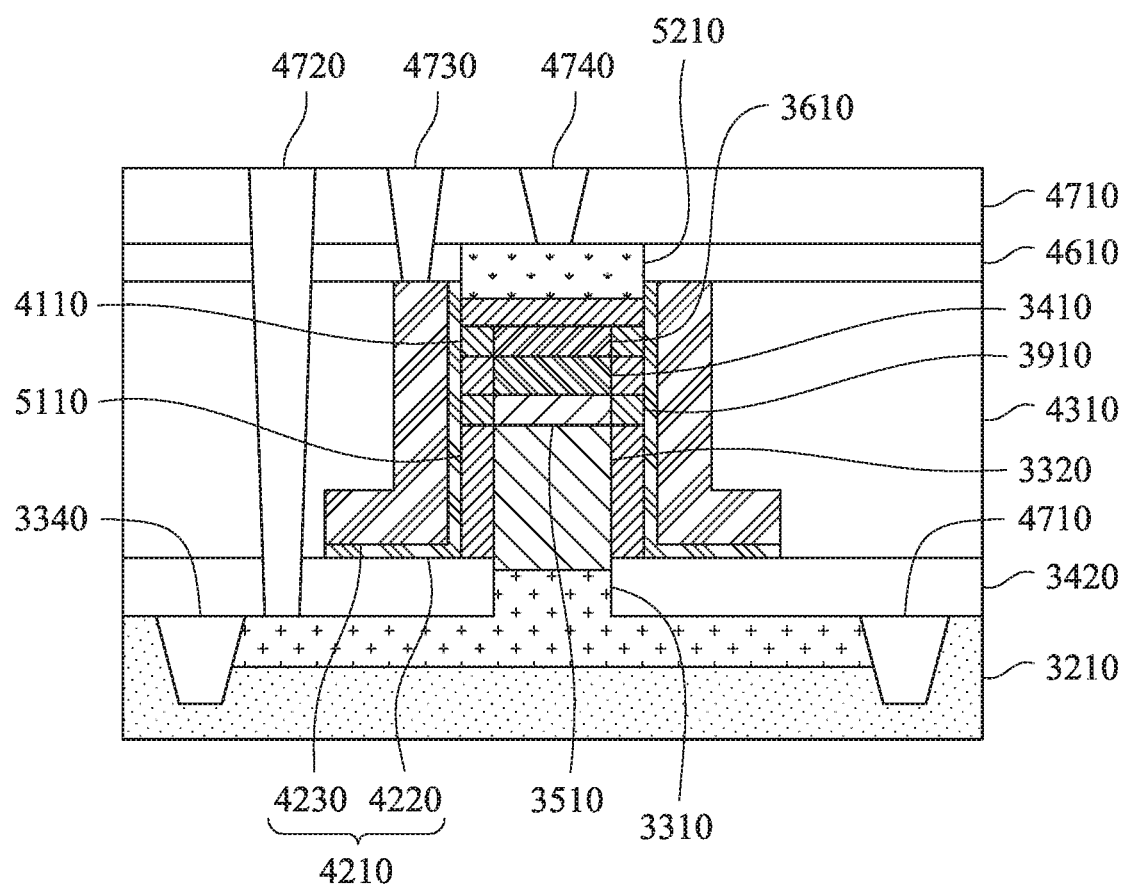

It is understood that additional operations may be implemented before, during, and after the method 3100, and some of the operations described may be replaced or eliminated for other embodiments of the method 3100. For example, illustrated in FIG. 50 is a flow chart of a method 5000 of manufacturing a semiconductor device in accordance with some embodiments of the present disclosure. FIGS. 51 to 53 are cross-sectional views illustrating a semiconductor device at various stages of manufacturing in accordance with some embodiments of the present disclosure.

Because blocks 3110-3118, 3124, and 3128-3132 of method 5000 are similar to those described above with respect to blocks 3110-3118, 3124, and 3128-3132 of method 3100, a detailed description thereof is dispensed herewith for the sake of brevity.

Method 5000 differs from method 3100 in that method 5000 does not include blocks 3120, 3122 and 3126. Moreover, method 5000 further includes blocks 5010 and 5020. As such, as illustrated in FIG. 53, a shell 5110 is interposed between the core channel region 3320 and a drain region 5210. After block 3118 where the doped barrier layer 3410 is formed, the method 5000 proceeds to block 5010 where a shell 5110 is formed to wrap the core channel region 3320 and the graded doped barrier layer 3410. Referring to the example of FIG. 51, in some embodiments of block 5010, the shell 5110 is formed to in contact with sidewalls of the core channel region 3320 and the doped barrier layer 3410 and in contact with a top surface of the doped barrier layer 3410. Thus, the core channel region 3320 and the doped barrier layer 3410 are wrapped by the shell 5110. The shell 5110 is similar in many respects to those discussed above in association with the shell 1010' in FIG. 10.

After block 5010 where the shell 5110 is formed, the method 5000 proceeds to block 5020 where a drain region is formed over the shell 5110. Referring to the example of FIG. 52, in some embodiments of block 5020, a drain region 5210 is formed over the shell 5110. The drain region 5210 is similar in many respects to those discussed above in association with the drain region 4020 in FIG. 40.

Thereafter, the gate stack unit 4210 and the contacts 4720, 4730, and 4740 are formed, resulting in the semiconductor device of FIG. 53. As illustrated therein, the semiconductor device includes the shell 5110 wraps around the doped barrier layer 3410 and the core channel region 3320 and is interposed between the doped barrier layer 3410 and the drain region 5210.

Based on the above discussions, it can be seen that some embodiments of the present disclosure offer advantages over TFET devices. It is understood, however, that other embodiments may offer additional advantages, and not all advantages are necessarily disclosed herein, and that no particular advantage is required for all embodiments.

Figure 54:
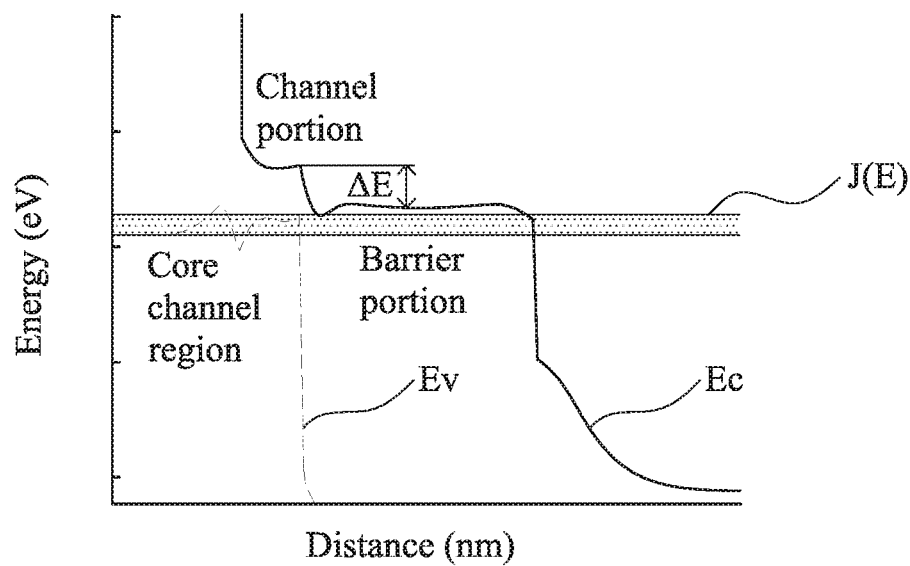
FIG. 54 illustrates an energy band diagram for a semiconductor device on off-state in accordance with some embodiments of the present disclosure.

One of the advantages of the present disclosure is that a conduction energy band (for n-type device) or a valence energy band (for p-type device) of the channel portion of the shell of the device is substantially aliened with a conduction energy band (for n-type device) or a valence energy band (for p-type device) of the barrier portion of the shell of the device. Reference is made to FIG. 54. FIG. 54 is an energy band diagram for the semiconductor devices on off-state. Ev is the valence band in the core channel region. Ec is the conduction band in the drain region and the shell above the barrier layer, and J(E) is the spectral current density. As illustrated in FIG. 54 (an n-type device), the shell band mismatch, i.e., the difference ΔE between the conduction energy band of the channel portion and the conduction energy band of the barrier portion, at off-state, is small (i.e., the conduction energy band of the channel portion substantially aligned with the conduction energy band of the barrier portion) due to the electrostatic modulation provided by doped barrier layer, dual material shell, and/or dual gate with different work functions. In certain embodiments, the conduction band energy difference ΔE is less than or equal to about 0.35 eV. In some embodiments, the conduction band energy difference ΔE is less than or equal to about 0.2 eV. In some other embodiments, the conduction band energy difference ΔE is less than or equal to about 0.1 eV. Devices including graded doped barrier layer, graded doped shell, dual material shell, and/or two gates provide electrostatic modulation at the barrier portion of the shell. The conduction/valence energy band of the barrier portion can be substantially aligned with the conduction/valence energy band of the channel portion of the shell. With such a configuration, the on-state current of the semiconductor device can be increased with low power consumption.

Figure 55:
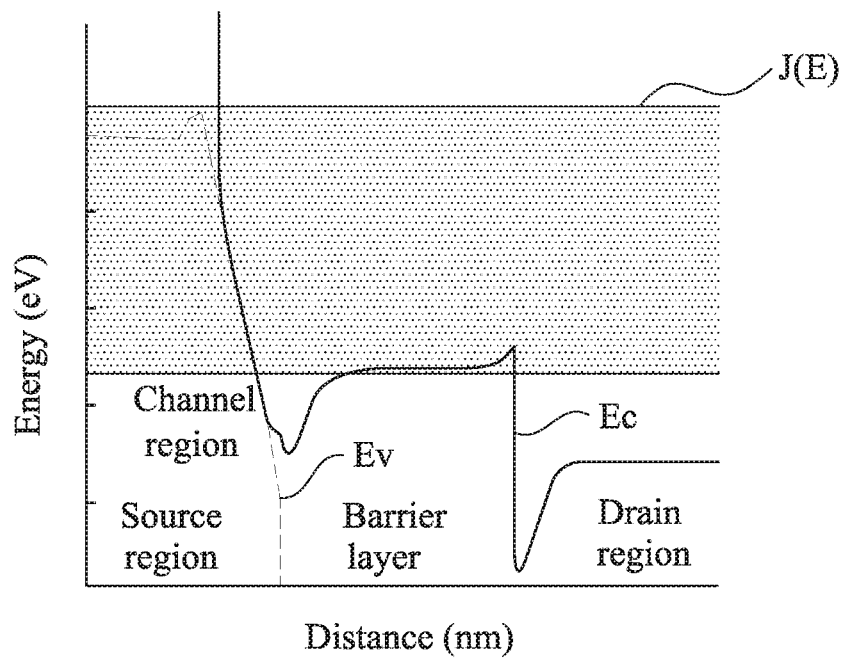
FIG. 55 illustrates an energy band diagram for a semiconductor device on on-state in accordance with some embodiments of the present disclosure.

The other advantage of the present disclosure is that an interfacial energy band barrier in the shell which is related to piling up of charges at an interface between a barrier layer and channel/drain region of the semiconductor device is suppressed. Reference is made to FIG. 55. FIG. 55 is an energy band diagram for the semiconductor devices on on-state. Ev, Ec, and J(E) are similar in many respects to those discussed above in association with the Ev, Ec, and J(E) in FIG. 54. As illustrated in FIG. 55, the interfacial energy band barriers in the shell at the interface between the barrier layer and the core channel region is suppressed by the graded doped barrier layer and the graded doped shell, such that the boundary between the conduction band of the shell over the barrier layer and the valence band of the core channel region is substantially smooth (i.e., substantially vertical). Similarly, the interfacial energy band barriers in the shell at the interface between the barrier layer and the drain region is suppressed by the graded doped barrier layer and the graded doped shell, such that the boundary between the conduction band of the shell over the barrier layer and the conduction band of the drain region substantially has a cliff-shape (i.e., forms a substantially 90 degree angle). Devices including graded doped barrier layer, graded doped shell, and/or two gates provide electrostatic modulation at the interface between the barrier layer and the channel/drain region. The interfacial energy band barriers in the shell over the interface between the barrier layer and the channel/drain region can be suppressed. With such configuration, the on-state current of the semiconductor device can be increased with low power consumption.

According to some embodiments, a semiconductor includes source and drain regions, a core channel region, and a barrier layer. The core channel region is between the source and drain regions. The barrier layer is between the core channel region and the drain region. The barrier layer is a graded doped barrier layer.

According to some embodiments, a semiconductor device includes source and drain region, a core channel region, a barrier layer, and a shell. The core channel region is between the source and drain regions. The barrier layer is between the core channel region and the drain region. The shell is along the core channel region and the barrier layer. The shell is a graded doped shell.

According to some embodiments, a method for manufacturing a semiconductor device includes forming a source and drain regions. A core channel region is formed between the source and drain regions. A barrier layer is formed between the core channel region and the drain region. A first portion of a shell is formed along the core channel region. A second portion of the shell is formed along the barrier layer. The second portion of the shell includes a different material than the first portion of the shell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   source and drain regions;
   a core channel region between the source and drain regions; and
   a barrier layer between the core channel region and the drain region, wherein the barrier layer is a graded doped barrier layer, the graded doped barrier layer has a first portion adjacent a first interface between the core channel region and the barrier layer, and the first portion of the graded doped barrier layer is doped with dopants having the same conductivity type as dopants of the core channel region.

2. The semiconductor device of claim 1, wherein a doping concentration of the dopants of the first portion of the barrier layer is the same as a doping concentration of the dopants of the core channel region.

3. The semiconductor device of claim 1, wherein the graded doped barrier layer has a second portion adjacent a second interface between the drain region and the barrier layer, and the second portion of the graded doped barrier layer is doped with dopants having the same conductivity type as dopants of the drain region.

4. The semiconductor device of claim 3, wherein a doping concentration of the dopants of the second portion of the barrier layer is equal to or greater than a doping concentration of the dopants of the drain region.

5. The semiconductor device of claim 1, further comprising a shell over the core channel region and the barrier layer, and including a portion of the shell between the barrier layer and the drain region.

6. The semiconductor device of claim 1, further comprising a gate stack over the core channel region, the barrier layer, and the drain region.

7. The semiconductor device of claim 1, further comprising:
   a first gate stack over the core channel region and the barrier layer; and
   a second gate stack over the barrier layer and the drain region.

8. A semiconductor device, comprising:
   source and drain regions;
   a core channel region between the source and drain regions;
   a barrier layer between the core channel region and the drain region; and
   a shell along the core channel region and the barrier layer, wherein the shell is a graded doped shell.

9. The semiconductor device of claim 8, wherein the graded doped shell has a doped portion above the barrier layer doped with dopants having the same conductivity type as dopants of the drain region.

10. The semiconductor device of claim 9, wherein a doping concentration of the dopants of the doped portion of the shell is equal to or greater than a doping concentration of the dopants of the drain region.

11. The semiconductor device of claim 8, wherein the graded doped shell has spaced apart first and second doped portions above the barrier layer doped with dopants having the same conductivity type as dopants of the drain region.

12. A semiconductor device, comprising:
    source and drain regions;
    a core channel region between the source and drain regions;
    a barrier layer between the core channel region and the drain region; and
    a shell having a first portion and a second portion that includes a different material than the first portion, wherein the first portion of the shell is along the core channel region, and second portion of the shell is along the barrier layer.

13. The semiconductor device of claim 12, wherein the barrier layer has a first portion adjacent an interface between the core channel region and the barrier layer doped with dopants having the same conductivity type as dopants of the core channel region.

14. The semiconductor device of claim 13, wherein a doping concentration of the dopants of the first portion of the barrier layer is the same as a doping concentration of the dopants of the core channel region.

15. The semiconductor device of claim 13, wherein the barrier layer has a second portion adjacent an interface between the drain region and the barrier layer doped with dopants having different conductivity type from dopants of the core channel region.

16. The semiconductor device of claim 15, wherein the first and second portions of the barrier layer are aligned with the second portion of the shell.

17. The semiconductor device of claim 15, wherein the shell further has a doped region above the second portion of the barrier layer doped with dopants having the same conductivity type as dopants of the second portion of the barrier layer.

18. The semiconductor device of claim 13, wherein the shell further has a doped region above the first portion of the barrier layer doped with dopants having different conductivity type from dopants of the first portion of the barrier layer.

19. The semiconductor device of claim 12, wherein the second portion of the shell includes a material with a negative valence band offset versus a material of the first portion of the shell.

20. The semiconductor device of claim 6, wherein the gate stack comprises a gate dielectric layer over the core channel region, the barrier layer, and the drain region and a gate electrode over the gate dielectric layer, and the gate electrode has a portion vertically overlapping the drain region.

* * * * *